United States Patent
Morise et al.

(10) Patent No.: US 9,705,073 B2
(45) Date of Patent: Jul. 11, 2017

(54) MAGNETIC MEMORY ELEMENT AND MAGNETIC MEMORY

(71) Applicant: KABUSHIKI KAISHA TOSHIBA, Tokyo (JP)

(72) Inventors: Hirofumi Morise, Kanagawa (JP); Tsuyoshi Kondo, Kanagawa (JP); Yasuaki Ootera, Kanagawa (JP); Takuya Shimada, Kanagawa (JP); Michael Arnaud Quinsat, Kanagawa (JP); Shiho Nakamura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/248,472

(22) Filed: Aug. 26, 2016

(65) Prior Publication Data
US 2017/0069829 A1    Mar. 9, 2017

(30) Foreign Application Priority Data
Sep. 9, 2015   (JP) .................. 2015-177996

(51) Int. Cl.
| | |
|---|---|
| G11C 11/06 | (2006.01) |
| H01L 43/02 | (2006.01) |
| H01L 43/08 | (2006.01) |
| H01L 43/10 | (2006.01) |
| H01L 27/22 | (2006.01) |

(Continued)

(52) U.S. Cl.
CPC ............ *H01L 43/02* (2013.01); *G11C 11/067* (2013.01); *G11C 11/161* (2013.01); *G11C 11/1653* (2013.01); *G11C 11/1673* (2013.01); *G11C 11/1675* (2013.01); *H01L 27/226* (2013.01); *H01L 43/08* (2013.01); *H01L 43/10* (2013.01)

(58) Field of Classification Search
CPC .................................................... G11C 11/161
USPC ........................................ 365/148, 158, 173
See application file for complete search history.

(56) References Cited

U.S. PATENT DOCUMENTS

| | | | |
|---|---|---|---|
| 2004/0130955 A1 | 7/2004 | Yamamoto et al. | |
| 2004/0213039 A1 | 10/2004 | Kawabata et al. | |

(Continued)

FOREIGN PATENT DOCUMENTS

| | | |
|---|---|---|
| JP | 2004-139681 | 5/2004 |
| JP | 2004-327583 | 11/2004 |
| JP | 2016-9806 | 1/2016 |

*Primary Examiner* — Hoai V Ho
*Assistant Examiner* — Jay Radke
(74) *Attorney, Agent, or Firm* — Finnegan, Henderson, Farabow, Garrett & Dunner, LLP

(57) ABSTRACT

According to one embodiment, a magnetic memory element includes a first magnetic unit, a second magnetic unit, a nonmagnetic unit, and a controller. The second magnetic unit includes a first portion and a second portion. The first portion includes a first region and a second region. The controller performs a first operation and a second operation. In the first operation, the controller changes a direction of a magnetization of the first region by causing a first current to flow through the first portion in a first current direction. The first current has a first current value. In the second operation, the controller changes a direction of a magnetization of the second region by causing a second current to flow through the first portion in a second current direction. The second current has a second current value. The second current value is less than the first current value.

17 Claims, 15 Drawing Sheets

(51) Int. Cl.
*G11C 11/16* (2006.01)
*G11C 11/067* (2006.01)

(56) References Cited

U.S. PATENT DOCUMENTS

| 2009/0135526 | A1* | 5/2009 | Dieny | H01L 43/08 |
| | | | | 360/314 |
| 2014/0269038 | A1* | 9/2014 | Shimomura | G11C 11/165 |
| | | | | 365/158 |
| 2015/0380638 | A1* | 12/2015 | Ootera | G11C 19/0841 |
| | | | | 257/421 |

* cited by examiner

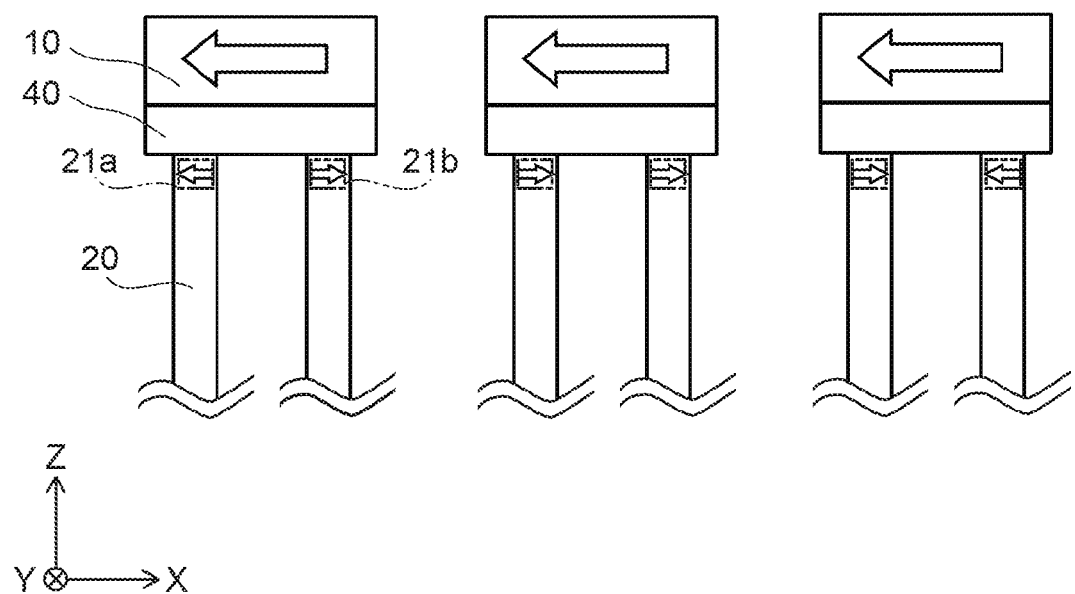
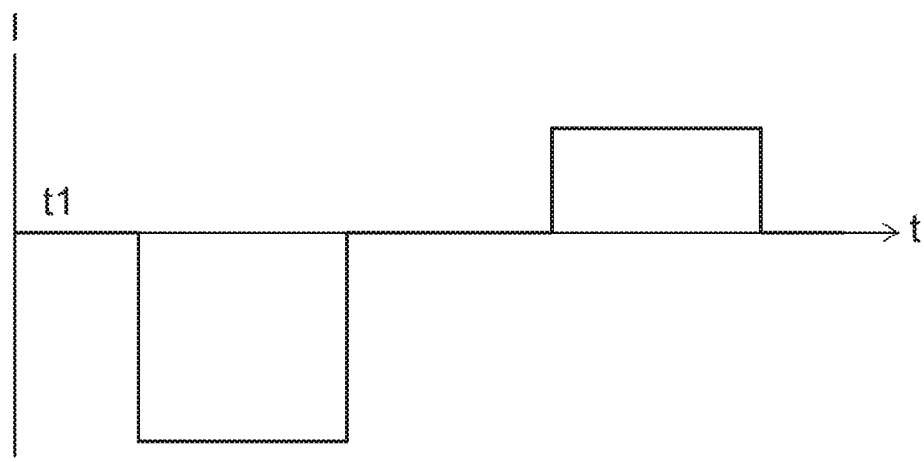

FIG. 5A    FIG. 5B    FIG. 5C
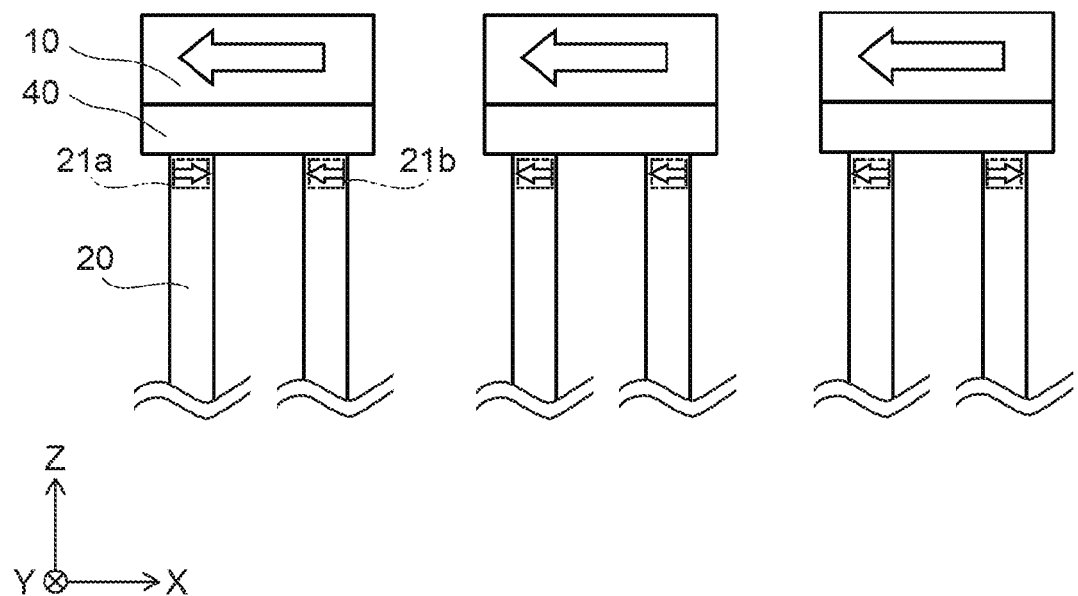
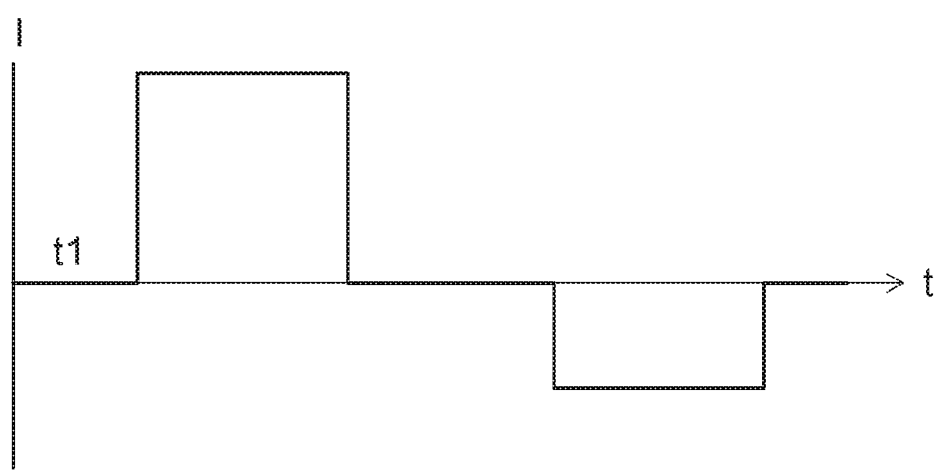
FIG. 5D

MAGNETIC MEMORY ELEMENT AND MAGNETIC MEMORY

CROSS-REFERENCE TO RELATED APPLICATIONS

This application is based upon and claims the benefit of priority from Japanese Patent Application No. 2015-177996, filed on Sep. 9, 2015; the entire contents of which are incorporated herein by reference.

FIELD

Embodiments described herein relate generally to a magnetic memory element and a magnetic memory.

BACKGROUND

There is a magnetic memory element in which a magnetic unit having a tubular configuration is used. It is desirable for the structure of the magnetic memory element to be suited to higher integration.

BRIEF DESCRIPTION OF THE DRAWINGS

FIG. 4A to FIG. 4C are schematic cross-sectional views showing the nonmagnetic unit, the first magnetic unit, and one portion of the second magnetic unit and FIG. 4D is graph of examples of relationships between time t and a current I flowing through the second magnetic unit;

FIG. 5A to FIG. 5C are schematic cross-sectional views showing the nonmagnetic unit, the first magnetic unit, and one portion of the second magnetic unit and FIG. 5D is graph of examples of relationships between time t and a current I flowing through the second magnetic unit;

DETAILED DESCRIPTION

Figure 1:
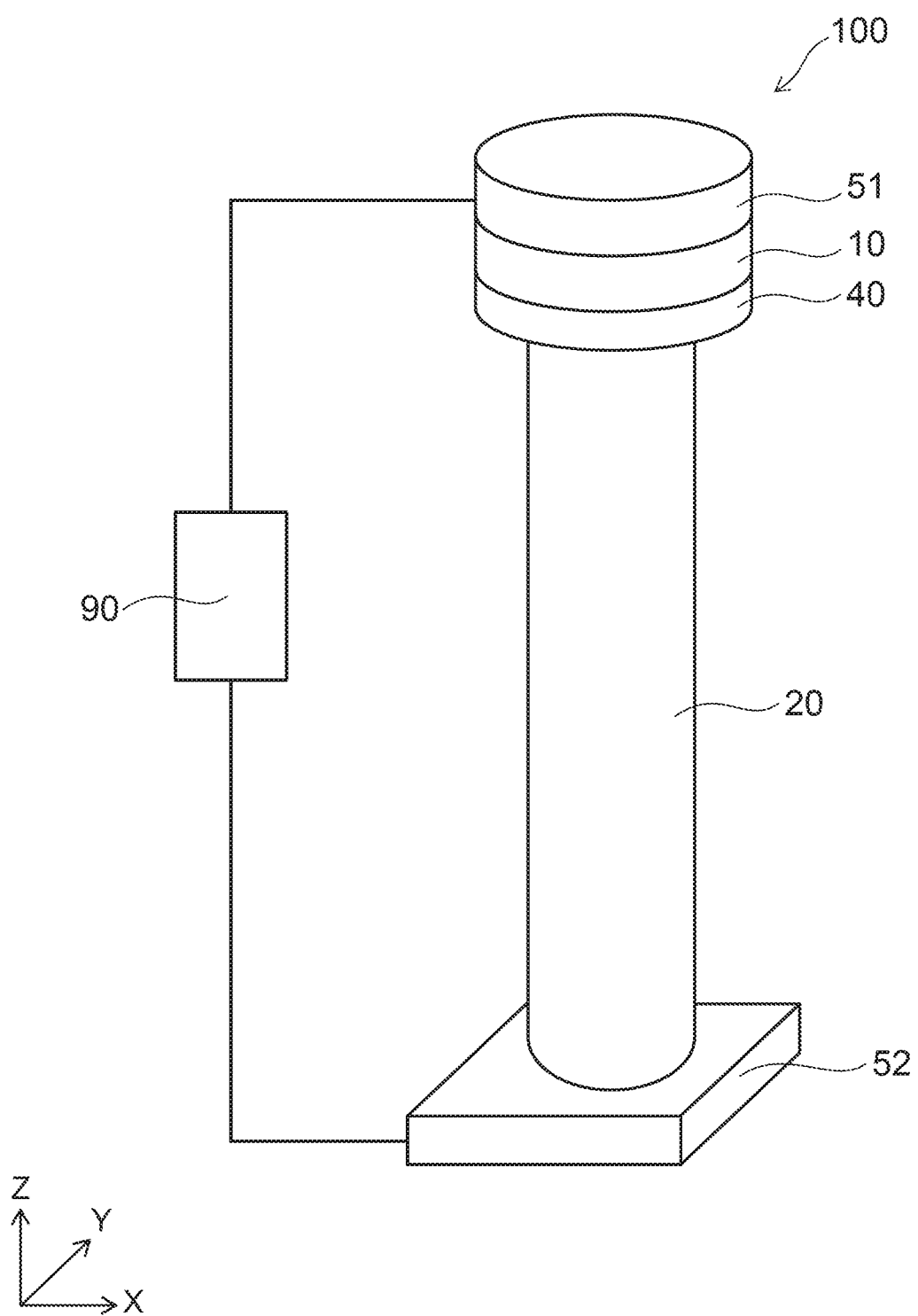
FIG. 1 is a schematic perspective view showing an example of a magnetic memory element according to a first embodiment.

According to one embodiment, a magnetic memory element includes a first magnetic unit, a second magnetic unit, a nonmagnetic unit, and a controller. The second magnetic unit has a tubular configuration extending in a first direction. The second magnetic unit includes a first portion and a second portion. The first portion is provided between the first magnetic unit and the second portion. The first portion includes a first region and a second region. The first region has a first saturation magnetization, a first magnetic anisotropy, and a first damping constant. The second region is arranged with the first region in a second direction. The second direction is perpendicular to the first direction. The second region has at least one of a second saturation magnetization smaller than the first saturation magnetization, a second magnetic anisotropy smaller than the first magnetic anisotropy, and a second damping constant smaller than the first damping constant. The nonmagnetic unit is provided between the first magnetic unit and the second magnetic unit. The controller is electrically connected to the first magnetic unit and the second magnetic unit. The controller performs a first operation and a second operation. In the first operation, the controller changes a direction of a magnetization of the first region by causing a first current to flow through the first portion in a first current direction. The first current has a first current value. In the second operation, the controller changes a direction of a magnetization of the second region by causing a second current to flow through the first portion in a second current direction. The second current has a second current value. The second current value is less than the first current value. The first current direction is aligned with the first direction. The second current direction is the reverse of the first current direction.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

First Embodiment

FIG. 1 is a schematic perspective view showing an example of a magnetic memory element according to a first embodiment.

Figure 2:
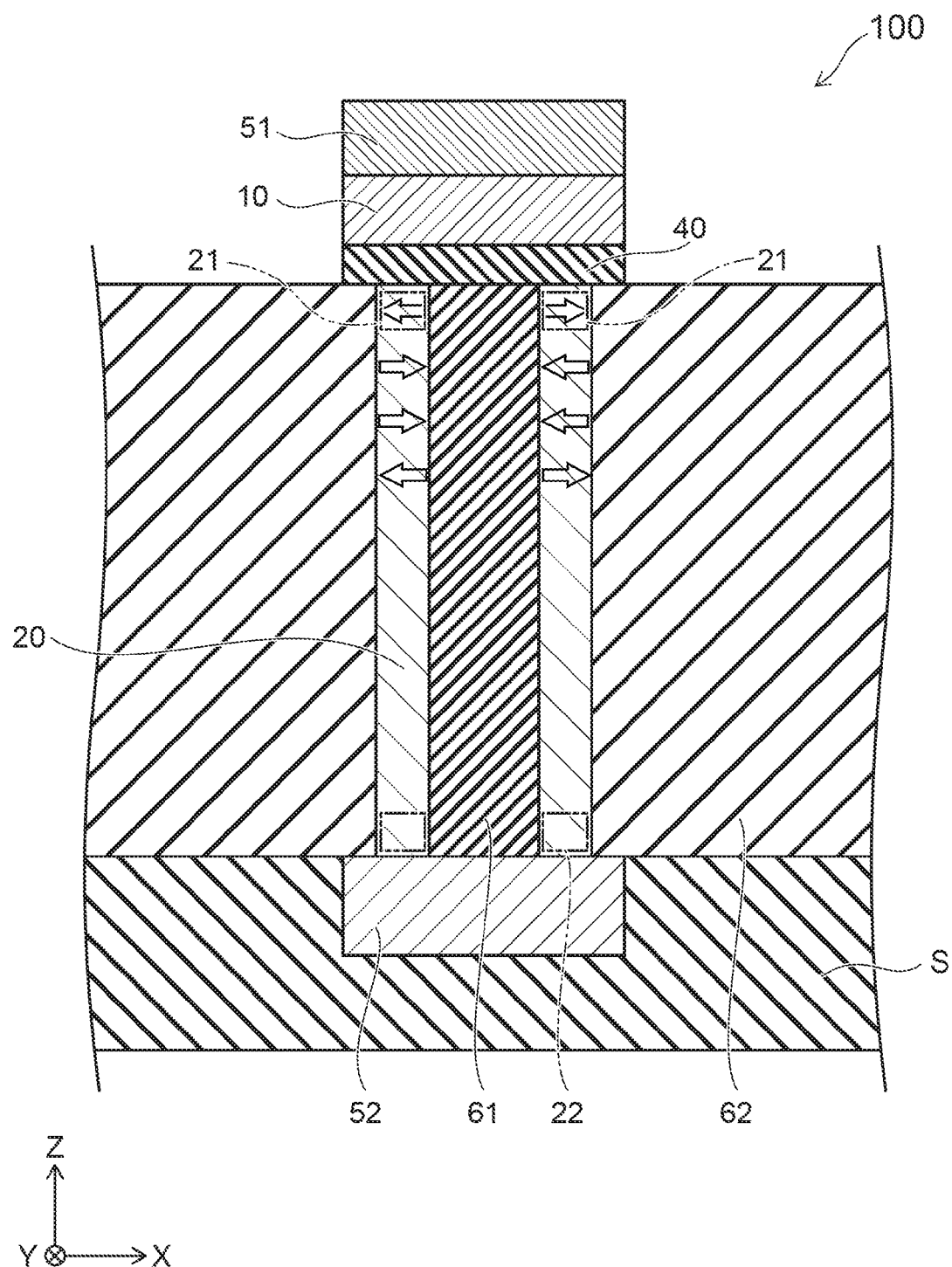
FIG. 2 is a schematic cross-sectional view showing the example of the magnetic memory element according to the first embodiment.

FIG. 2 is a schematic cross-sectional view showing the example of the magnetic memory element according to the first embodiment.

Figure 3A:
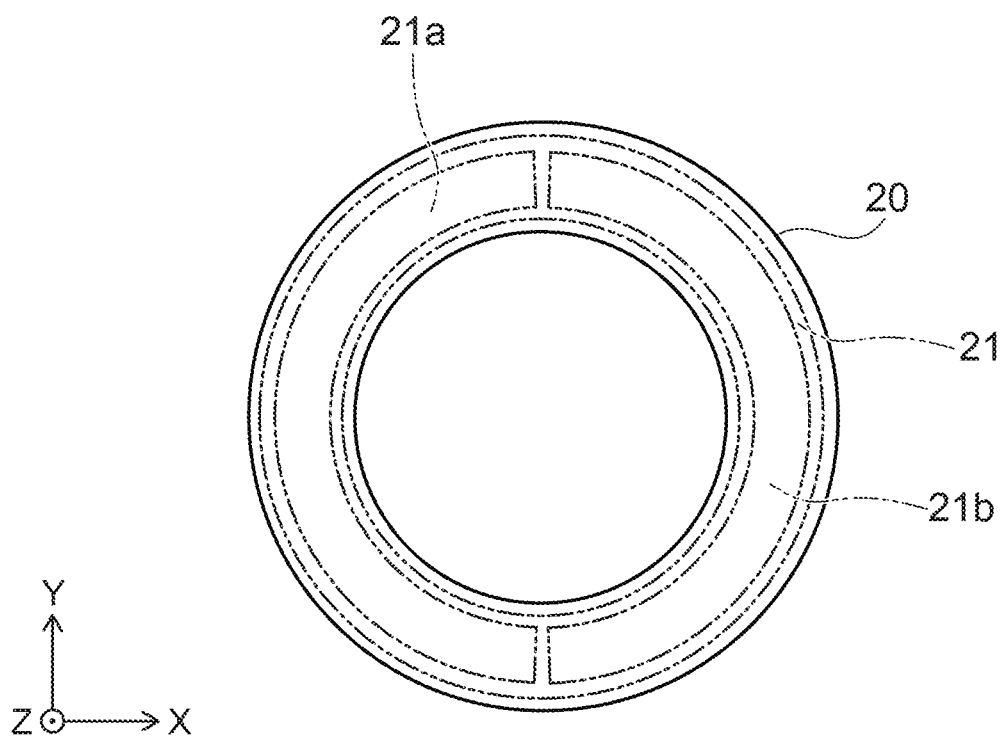
FIGS. 3A and 3B are schematic views showing an example of one portion of the magnetic memory element according to the first embodiment.
Figure 3B:
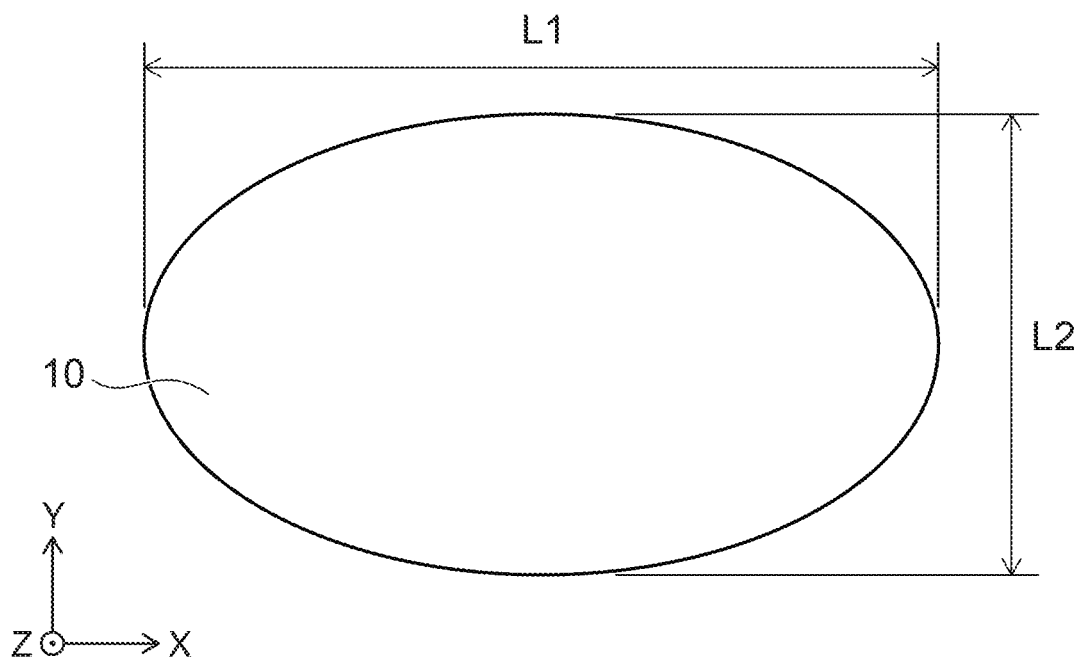

FIGS. 3A and 3B are schematic views showing an example of one portion of the magnetic memory element according to the first embodiment. Specifically, FIG. 3A is a plan view showing an example of a second magnetic unit 20. FIG. 3B is a plan view showing an example of a first magnetic unit 10.

As shown in FIG. 1 and FIG. 2, the magnetic memory element 100 includes a first magnetic unit 10, a second magnetic unit 20, a nonmagnetic unit 40, a first electrode 51, a second electrode 52, a first insulating unit 61, a second insulating unit 62, and a controller 90.

At least one portion of the nonmagnetic unit 40 is provided between the second magnetic unit 20 and at least one portion of the first magnetic unit 10 in a first direction. For example, the first magnetic unit 10, the second magnetic unit 20, and the nonmagnetic unit 40 are provided between the first electrode 51 and the second electrode 52 in the first direction. In the example shown in FIG. 1, the first magnetic unit 10 is provided between the first electrode 51 and the nonmagnetic unit 40 in the first direction. The second magnetic unit 20 is provided between one portion of the second electrode 52 and one portion of the nonmagnetic unit 40 in the first direction.

The first direction is, for example, a Z-direction shown in FIG. 1.

The second magnetic unit 20 has a tubular configuration. The second magnetic unit 20 extends in the first direction. As shown in FIG. 2, the second magnetic unit 20 includes multiple magnetic domains arranged in the first direction. In FIG. 2, the arrows marking the second magnetic unit 20 show an example of the magnetization directions of the magnetic domains.

The second magnetic unit 20 is provided around the first insulating unit 61. The second insulating unit 62 is provided around the second magnetic unit 20. The first insulating unit 61, the second magnetic unit 20, and the second insulating unit 62 overlap in a second direction and a third direction. The easy magnetization axis of the second magnetic unit 20 is a direction perpendicular to the first direction. The magnetization direction of each of the multiple magnetic domains included in the second magnetic unit 20 is a direction from the first insulating unit 61 toward the second insulating unit 62 or a direction from the second insulating unit 62 toward the first insulating unit 61.

For example, the first magnetic unit 10, the second magnetic unit 20, the nonmagnetic unit 40, the first electrode 51, the second electrode 52, the first insulating unit 61, and the second insulating unit 62 are provided on a substrate S.

To simplify the description hereinbelow, for the magnetization direction, the direction from the first insulating unit 61 toward the second insulating unit 62 is called "outward;" and the direction from the second insulating unit 62 toward the first insulating unit 61 is called "inward."

The second direction and the third direction are perpendicular to the first direction. The third direction intersects the second direction. The second direction is, for example, an X-direction shown in FIG. 1. The third direction is, for example, a Y-direction shown in FIG. 1.

For example, the first magnetic unit 10 is magnetized in the second direction. The magnetization direction of the first magnetic unit 10 changes less easily than the magnetization directions of the magnetic domains included in the second magnetic unit 20.

The first electrode 51 and the second electrode 52 are electrically connected to the controller 90. The controller 90 causes a current to flow in the first magnetic unit 10, the second magnetic unit 20, and the nonmagnetic unit 40 via the first electrode 51 and the second electrode 52.

As shown in FIG. 2, the second magnetic unit 20 includes a first portion 21 and a second portion 22. The first portion 21 is positioned between the second portion 22 and the nonmagnetic unit 40. For example, the first portion 21 and the second portion 22 are end portions of the second magnetic unit 20 in the first direction. For example, the first portion 21 contacts the nonmagnetic unit 40.

As shown in FIG. 3A, the first portion 21 includes a first region 21a and a second region 21b. At least one portion of the first region 21a and at least one portion of the second region 21b are arranged in the second direction.

The saturation magnetization of the second region 21b is smaller than the saturation magnetization of the first region 21a. Alternatively, the perpendicular magnetic anisotropy of the second region 21b is smaller than the perpendicular magnetic anisotropy of the first region 21a. Alternatively, the damping constant of the magnetization dynamics in the second region 21b is smaller than the damping constant in the first region 21a. Therefore, the current density of the current necessary to change the magnetization direction of the second region 21b by a method described below is lower than the current density of the current necessary to change the magnetization direction of the first region 21a.

To sense the magnetization direction of the first magnetic unit 10 with higher precision than the magnetization direction of the first portion 21, it is desirable for the magnetization direction of the first magnetic unit 10 to be a direction (the second direction) from the first region 21a toward the second region 21b or a direction from the second region 21b toward the first region 21a (a direction opposite to the second direction).

To this end, as shown in FIG. 3B, it is desirable for a length L1 in the second direction of the first magnetic unit 10 to be longer than a length L2 in the third direction of the first magnetic unit 10. For example, it is desirable for the configuration of the first magnetic unit 10 in a cross section along the X-Y plane to be an ellipse. The configuration of the first magnetic unit 10 in the cross section along the X-Y plane may be a rectangle, a diamond, a parallelogram, or a polygon. To orient the magnetization direction of the first magnetic unit 10 in the second direction, it is desirable for the ratio (L1:L2) of the length L1 to the length L2 to be not less than 1:1 and not more than 4:1.

FIG. 4A to FIG. 5D are schematic views showing examples of writing operations of the magnetic memory element 100 according to the first embodiment.

FIG. 4A to FIG. 4C and FIG. 5A to FIG. 5C are schematic cross-sectional views showing the nonmagnetic unit 40, the first magnetic unit 10, and one portion of the second magnetic unit 20. In the drawings, the arrows show an example of the directions of the magnetizations of the portions.

FIG. 4D and FIG. 5D are graphs of examples of relationships between time t and a current I flowing through the second magnetic unit 20. In these graphs, the current flowing in a first current direction is positive; and the current flowing in a second current direction reverse to the first current direction is negative. For example, the first current direction is aligned with the first direction and is the direction from the second electrode 52 toward the first electrode 51.

In the magnetic memory element 100, for example, writing to the first portion 21 is performed by current-induced magnetization switching by use of the spin transfer.

In the example shown in FIGS. 4A to 4D, at a time t1, for example, the magnetization direction of the first portion 21 is outward as shown in FIG. 4A. The controller 90 writes to the first portion 21 by performing a first operation and a second operation. In the first operation, the controller 90 causes a current having a first current value to flow through the second magnetic unit 20 in a second current direction. At this time, electrons flow in the first current direction. By the first operation as shown in FIG. 4B, the magnetization direction of the first region 21a included in the first portion 21 changes to the direction opposite to that of the first magnetic unit 10.

After the first operation, in the second operation, the controller 90 causes a current having a second current value to flow through the second magnetic unit 20 in a first current direction. The second current value is less than the first current value. By the second operation as shown in FIG. 4C, the magnetization direction of the second region 21b included in the first portion 21 changes to the same direction as that of the first magnetic unit 10. For example, the ratio of the first current value to the second current value is not less than 1.5:1 and not more than 5:1.

By the operations described above, the magnetization direction of the first portion 21 changes from outward to inward.

In the example shown in FIGS. 5A to 5D, at the time t1, the magnetization direction included in the first portion 21 is inward as shown in FIG. 5A. In the first operation, the controller 90 causes the current having the first current value to flow through the second magnetic unit 20 in the first current direction. By the first operation as shown in FIG. 5B, the magnetization direction of the first region 21a included in the first portion 21 changes to the same direction as that of the first magnetic unit 10.

After the first operation, in the second operation, the controller 90 causes the current having the second current value to flow through the second magnetic unit 20 in the second current direction. By the second operation as shown in FIG. 5C, the magnetization direction of the second region 21b included in the first portion 21 changes to the direction opposite to that of the first magnetic unit 10.

By the operations described above, the magnetization direction of the first portion 21 changes from inward to outward.

In FIG. 4A to FIG. 5D, the writing operations to the second magnetic unit 20 are described for the case where the magnetization direction of the first magnetic unit 10 is the direction opposite to the second direction. The writing operations to the second magnetic unit 20 can be performed similarly using spin transfer magnetization reversal even in the case where the magnetization direction of the first magnetic unit 10 is the same as the second direction.

For example, the shift operation of the magnetic domains included in the second magnetic unit 20 is performed by causing a current having a third current value to flow through the second magnetic unit 20 in the first current direction or the second current direction. At this time, for example, the third current is caused to flow at a prescribed spacing in a pulse form. The third current value is greater than the first current value and greater than the second current value. To suppress the shift of the magnetic domains included in the second magnetic unit 20 when performing the writing operation, it is desirable for the current value that is necessary for the writing operation to be less than the current value that is necessary for the shift operation.

After writing to the first portion 21, the magnetic domains included in the second magnetic unit 20 can be shifted toward the second electrode 52 by causing a current to flow through the second magnetic unit 20 in the first current direction. By sequentially performing the first operation, the second operation, and the shift operation repeatedly, it is possible to perform sequential writing to the multiple magnetic domains included in the second magnetic unit 20.

The reading of the magnetization direction of the first portion 21 is performed by utilizing the magnetoresistance effect between the first portion 21 and the first magnetic unit 10 via the nonmagnetic unit 40. When performing the read-out operation, a current having a fourth current value is caused to flow between the first magnetic unit 10 and the first portion 21. When performing the read-out operation, it is desirable for the fourth current value to be less than the first current value and the second current value to suppress the occurrence of writing to the first portion 21.

The spin polarization of the second region 21b is smaller than the spin polarization of the first region 21a because the saturation magnetization of the second region 21b is smaller than the saturation magnetization of the first region 21a. Therefore, the signal that is read by utilizing the magnetoresistance effect is affected mainly by the magnetization direction of the first region 21a. Specifically, the electrical resistance is higher in the case where the magnetization direction of the first region 21a is opposite to the magnetization direction of the first magnetic unit 10 than in the case where the magnetization direction of the first region 21a is the same as the magnetization direction of the first magnetic unit 10. The magnetization direction of the first portion 21 can be read by sensing the resistance change.

After reading the magnetization direction of the first portion 21, the magnetic domains included in the second magnetic unit 20 can be shifted toward the first magnetic unit 10 by causing a current to flow through the second magnetic unit 20 in the second current direction. It is possible to sequentially read the magnetization directions of the magnetic domains included in the second magnetic unit 20 by repeatedly performing the read-out operation and the shift operation alternately.

In the magnetic memory element according to the embodiment, the first portion 21 includes the first region 21a and the second region 21b; and the controller 90 sequentially changes the directions of the magnetizations of these regions. By employing such a configuration, it is possible to provide a magnetic memory element that is more suited to higher integration.

A specific example of the component included in the magnetic memory element 100 is described below.

For example, the length in the first direction of the second magnetic unit 20 is not less than 10 times the length in the second direction of the second magnetic unit 20 and not less than 10 times the length in the third direction of the second magnetic unit 20. From the perspective of the manufacturing processes, it is desirable for the configuration of the outer edge of the second magnetic unit 20 in a cross section perpendicular to the first direction to be, for example, a circle, an ellipse, a square, a rectangle, a diamond, a parallelogram, or a polygon. To suppress the occurrence of an unintended distribution of the magnetization directions in the magnetic domains included in the second magnetic unit 20, it is desirable for the length in the second direction of the second magnetic unit 20 to be 100 nm or less and for the length in the third direction of the second magnetic unit 20 to be 100 nm or less.

The length in the first direction of the first portion 21 is, for example, not less than 1 nm and not more than 10 nm. It is desirable for the proportion occupied by the second region 21b of the cross section of the first portion 21 along the X-Y plane to be not less than ⅓ and not more than ⅔.

For the multiple magnetic domains included in the second magnetic unit 20, the change of the magnetization direction occurs continuously at the boundary vicinity of two mutually-adjacent magnetic domains. The change region is called the domain wall. The change is roughly expressed by $\pm \tan h(2(z-z_0)/w)$. $z$ is the coordinate in the first direction. $z_0$ is the coordinate in the first direction of the center in the first direction of the domain wall. w is the length in the first direction of the domain wall. The length w is a finite value determined by the exchange stiffness A, the anisotropic energy Ku, etc., of the magnetic body included in the second magnetic unit 20. The theoretical formula of the length w is expressed by $w=2(A/Ku)^{1/2}$. For example, w is about 6 nm in the case where $A=1$ μerg/cm and $Ku=10^7$ erg/cm$^3$.

The length in the first direction of each magnetic domain is, for example, not less than 6 nm and not more than 200 nm. It is desirable for the length in the first direction of the magnetic domain to be not less than twice the length w in the first direction of the domain wall.

More desirably, the length in the first direction of the magnetic domain is not less than 10 nm and not more than 100 nm. By employing such a configuration, the interactions between adjacent domain walls, the fluctuation of the movement speed of the domain wall, and the instability due to heat can be improved.

The second magnetic unit 20 may include a material in which the easy magnetization axis of the second magnetic unit 20 is a direction perpendicular to the first direction. Because the second magnetic unit 20 extends in the first direction, the demagnetizing field becomes large when the magnetization direction of the second magnetic unit 20 is oriented in a direction other than the first direction. To orient the magnetization direction of the second magnetic unit 20 in a direction other than the first direction, it is desirable for the second magnetic unit 20 to include a material having a magnetic anisotropy that has a magnitude sufficient for the demagnetizing field.

The following materials may be used as the material having the large uniaxial magnetic anisotropy Ku.

An alloy made of a combination of at least one element selected from the group consisting of iron (Fe), cobalt (Co), nickel (Ni), manganese (Mn), and chrome (Cr), and at least one element selected from the group consisting of platinum (Pt), palladium (Pd), iridium (Ir), ruthenium (Ru), and rhodium (Rh). For example, by using an alloy of at least one of Fe and Co and at least one of Pt and Pd, the length in the first direction of the domain wall can be short; and the recording density can be increased.

The value of the uniaxial anisotropy constant can be adjusted by changing the composition, the crystalline order, etc., of the magnetic material included in the second magnetic unit 20. For example, the crystalline order can be changed by heat treatment and the temperature of the heat treatment.

The material of the second magnetic unit 20 may include a magnetic material that has a crystal structure of a hcp structure (hexagonal close-packed structure) and has magnetic anisotropy in a direction perpendicular to the first direction. Such a magnetic material may have cobalt (Co) as a major component and may further include another metal. Or, another metal that has a hcp structure and is magnetic may be used.

It is desirable for the easy axis of the magnetic anisotropy of the second magnetic unit 20 to be a direction perpendicular to the first direction. From this perspective, it is favorable to use Co, CoPt, FePt, a stacked film of Co/Ni, etc., in which the c-axis of hcp is oriented in a direction perpendicular to the first direction. CoPt may be an alloy.

Also, a material that is an alloy of a rare-earth element and a transition metal element and has magnetic anisotropy in a direction perpendicular to the first direction may be used. Specifically, at least one of GdFe, GdCo, GdFeCo, TbFe, TbCo, TbFeCo, GdTbFe, GdTbCo, DyFe, DyCo, and DyFeCo may be used. In such a case, the alloy has a ferrimagnetism in which the magnetic moment of the rare-earth atom and the magnetic moment of the transition metal atom have opposite direction components. Therefore, this is desirable because the net magnetization of the second magnetic unit 20 decreases, and the writing current can be reduced. The second magnetic unit 20 can be made in an amorphous state by using an alloy including Tb and Fe or an alloy including Tb and Co. By making the second magnetic unit 20 in the amorphous state, the magnetic properties of the second magnetic unit 20 are made uniform; and it is possible to stabilize the operations. By using an alloy including Gd and Fe or an alloy including Gd and Co, the transition temperature can be a sufficiently high temperature; and it is possible to stabilize the operations when the current is caused to flow through the second magnetic unit 20.

It is also possible to add other elements to the materials described above.

For example, a nonmagnetic element such as Ag, Cu, Au, Al, Mg, Si, Bi, Ta, B, C, O, N, Pd, Pt, Zr, Ir, W, Mo, Nb, H, etc., may be added. By adding the nonmagnetic element, various properties such as the magnetic properties, the crystallinity, the mechanical properties, the chemical properties, etc., can be adjusted.

The thickness in the first direction of the first magnetic unit 10 is, for example, not less than 5 nm and not more than 50 nm. From the perspective of the manufacturing processes, it is desirable for the configuration of the outer edge of the first magnetic unit 10 in the cross section perpendicular to the first direction to be, for example, a circle, an ellipse, a square, a rectangle, a diamond, a parallelogram, or a polygon. To suppress the occurrence of an unintended distribution of the magnetization directions in the first magnetic unit 10, it is desirable for the length in the second direction of the first magnetic unit 10 to be 100 nm or less and for the length in the third direction of the first magnetic unit 10 to be 100 nm or less.

The first magnetic unit 10 may include a material similar to the material of the second magnetic unit 20. The magnetic anisotropy of the first magnetic unit 10 may be smaller than the magnetic anisotropy of the second magnetic unit 20. Therefore, the material of the first magnetic unit 10 can be selected from more materials than the materials applicable to the second magnetic unit 20. The first magnetic unit 10 may include, in addition to the materials that may be included in the second magnetic unit 20 described above, a magnetic alloy including at least one element selected from the group consisting of iron (Fe), cobalt (Co), nickel (Ni), manganese (Mn), and chrome (Cr). For example, the first magnetic unit 10 may include permalloy (an FeNi alloy), a CoFe alloy, etc.

Figure 6A:
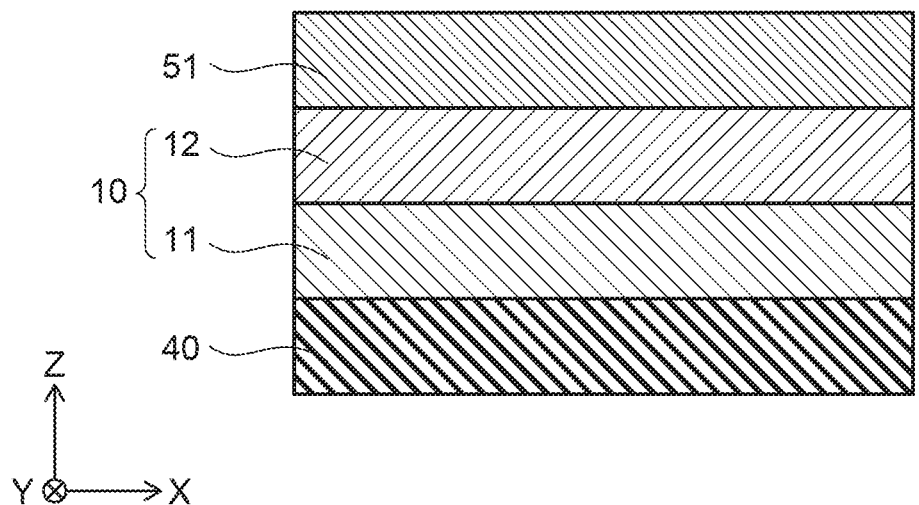
FIGS. 6A and 6B are schematic cross-sectional views showing examples of one portion of the magnetic memory element according to the first embodiment.
Figure 6B:
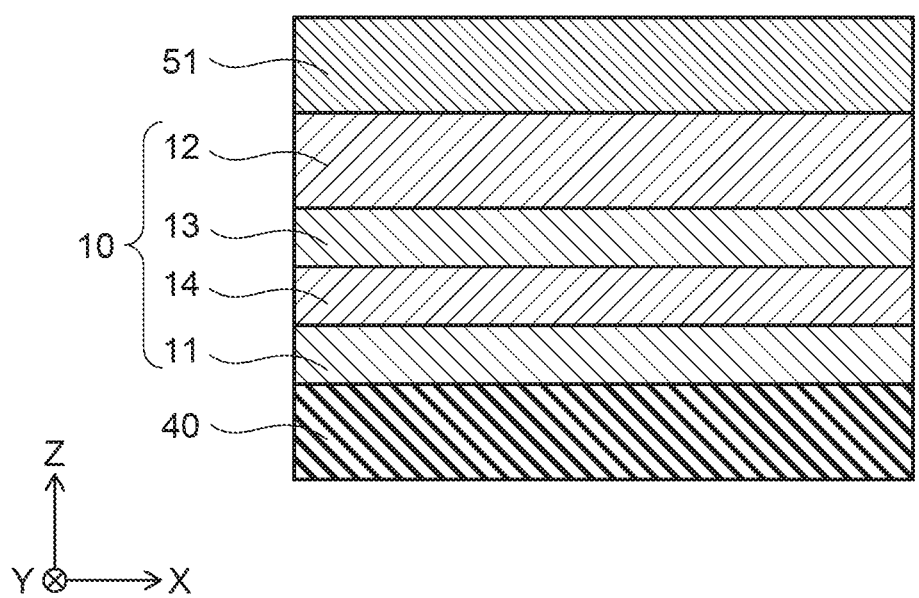

FIGS. 6A and 6B are schematic cross-sectional views showing examples of one portion of the magnetic memory element according to the first embodiment. Specifically, FIG. 6A and FIG. 6B are schematic cross-sectional views showing an example of the first magnetic unit 10.

As shown in FIG. 6A, the first magnetic unit 10 may include a first layer 11 and a second layer 12. The second layer 12 is provided between the first layer 11 and the first electrode 51. The first layer 11 may include a material similar to that of the second magnetic unit 20 described above. The second layer 12 includes an antiferromagnetic material. Fe—Mn, Pt—Mn, Pt—Cr—Mn, Ni—Mn, Pd—Mn, Pd—Pt—Mn, Ir—Mn, Pt—Ir—Mn, NiO, Fe$_2$O$_3$, a magnetic semiconductor, etc., may be used as the antiferromagnetic material. By providing the second layer 12, the magnetization direction of the first magnetic unit 10 does not change easily compared to the magnetization direction of the second magnetic unit 20.

As shown in FIG. 6B, the first magnetic unit 10 may further include a third layer 13 and a nonmagnetic layer 14. The third layer 13 is provided between the first layer 11 and the second layer 12. The nonmagnetic layer 14 is provided between the first layer 11 and the third layer 13. The third layer 13 includes, for example, a material similar to that of the second magnetic unit 20 described above. In such a case, the nonmagnetic layer 14 provides ferromagnetic or antiferromagnetic coupling between the first layer 11 and the third layer 13 by an interaction called a RKKY interaction. The antiferromagnetic coupling can be provided by adjusting the film thickness of the nonmagnetic layer 14. Such a case is desirable because the increase of the current that is necessary for the writing to the second magnetic unit 20 can be suppressed because the leakage magnetic field from the first layer 11 and the leakage magnetic field from the third layer 13 cancel each other. The nonmagnetic layer 14 includes, for example, at least one of Cu, Au, Ag, Ru, Ir, and Os. The thickness in the first direction of the nonmagnetic layer 14 is, for example, not less than 0.2 nm and not more than 10 nm.

Also, the efficiency of the magnetization reversal due to the spin transfer is increased by including a material having a high spin polarization in the first layer 11 and the third layer 13. It is desirable to increase the efficiency of the magnetization reversal because the read output can be improved by reducing the reversal current threshold or increasing the magnetoresistance ratio. It is desirable for a high spin polarization material called a half-metal to be used as the material included in the first layer 11 and the third layer 13. A Heusler alloy, a rutile-type oxide, a spinel-type oxide, a perovskite-type oxide, a double perovskite-type oxide, a sphalerite-type chromium compound, a sphalerite-type manganese compound, a pyrite-type manganese compound, a sendust alloy, or a magnetic semiconductor may be used as the half-metal. $Co_2MnSi$, $CrO_2$, $Fe_3O_4$, $La_{1-x}Sr_x$-$MnO_3$, etc., are specific examples of these materials. In the case where other layers are further provided between the first layer 11 and the nonmagnetic unit 40, it is desirable for the layer that is most proximal to the nonmagnetic unit 40 to include the high spin polarization material.

In the case where the first magnetic unit 10 has the structure shown in FIG. 6A or FIG. 6B, the magnetization direction of the first portion 21 can be read using the magnetoresistance effect between the first layer 11 and the first portion 21 via the nonmagnetic unit 40.

It is desirable for the thickness in the first direction of the nonmagnetic unit 40 to be less than the spin diffusion length of the nonmagnetic unit 40. To reduce the magnetostatic coupling between the first magnetic unit 10 and the second magnetic unit 20, it is desirable for the thickness in the first direction of the nonmagnetic unit 40 to be, for example, not less than 0.2 nm and not more than 20 nm.

A nonmagnetic metal or an insulating material may be used as the material of the nonmagnetic unit 40.

One of Au, Cu, Cr, Zn, Ga, Nb, Mo, Ru, Pd, Ag, Hf, Ta, W, Pt, and Bi may be used as the nonmagnetic metal. Alternatively, an alloy including one or more types of these nonmagnetic metals may be used.

In the case where the nonmagnetic unit 40 includes an insulating material, it is effective to cause the nonmagnetic unit 40 to function as a tunneling barrier layer to increase the magnetoresistance effect. In such a case, the nonmagnetic unit 40 may include at least one of $Al_2O_3$, $SiO_2$, MgO, AlN, $Bi_2O_3$, $MgF_2$, $CaF_2$, $SrTiO_3$, $AlLaO_3$, Al—N—O, Si—N—O, and a nonmagnetic semiconductor. At least one of ZnO, InMn, GaN, GaAs, $TiO_2$, Zn, and Te may be used as the nonmagnetic semiconductor. Alternatively, these materials doped with a transition metal may be used as the nonmagnetic semiconductor.

The material of the nonmagnetic unit 40 described above may not have perfectly stoichiometric ratios; and a deficiency of oxygen, nitrogen, fluorine, or the like, excessive or insufficient elements included in each material, etc., may exist. In the case where the nonmagnetic unit 40 includes an insulating material, it is desirable for the thickness in the first direction of the nonmagnetic unit 40 to be not less than 0.2 nm and not more than 5 nm.

Or, in the case where the nonmagnetic unit 40 includes an insulating material, the nonmagnetic unit 40 may locally include pinholes where current may flow.

The first electrode 51 and the second electrode 52 may include a metal such as aluminum, copper, etc.

An example of a method for manufacturing the magnetic memory element 100 according to the first embodiment will now be described.

FIG. 7A, FIG. 7B, FIG. 8A, and FIG. 8B are schematic cross-sectional views of processes, showing an example of manufacturing processes of the magnetic memory element 100 according to the first embodiment.

Figure 7A:
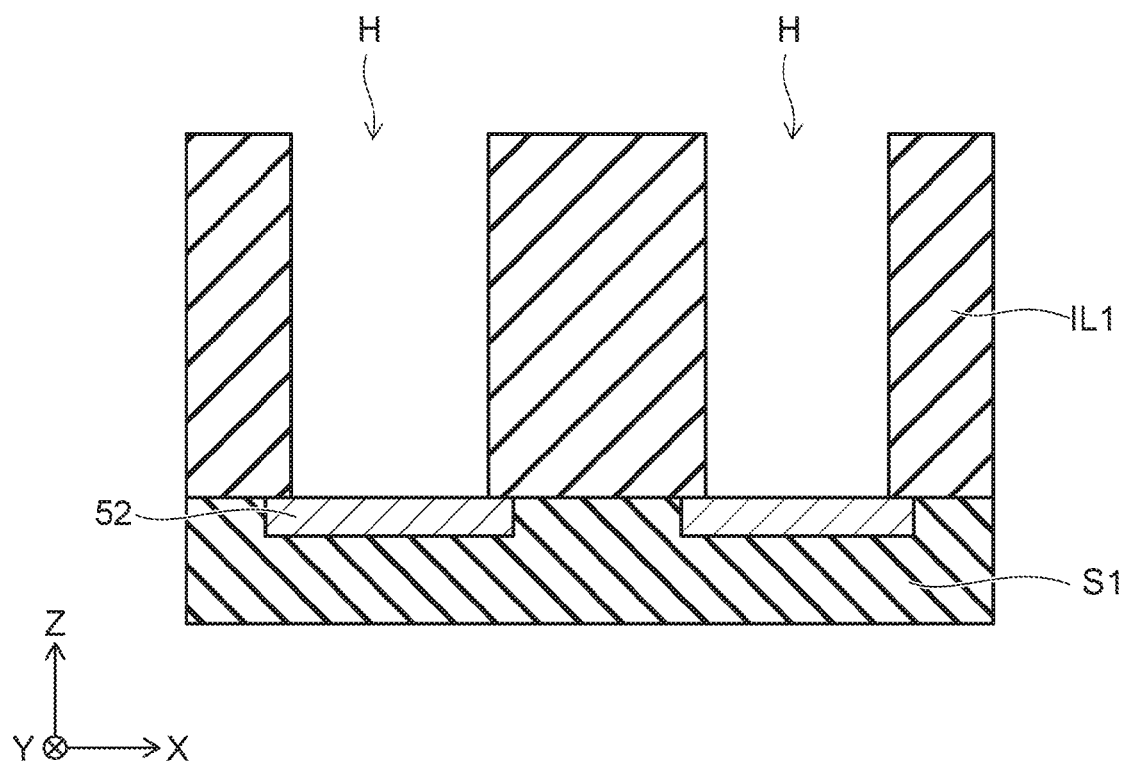
FIG. 7A, FIG. 7B, FIG. 8A, and FIG. 8B are schematic cross-sectional views of processes, showing an example of manufacturing processes of the magnetic memory element according to the first embodiment.

A structure body that includes a first layer S1 in which the second electrodes 52 are formed and a first insulating layer IL1 provided on the first layer S1 is prepared. As shown in FIG. 7A, multiple holes H that extend in the first direction are made in the first insulating layer IL1. The holes H are made to expose the second electrodes 52. The diameter of the hole H is, for example, 100 nm or less. For example, the holes H may be made by dry etching or anodic oxidation.

Figure 7B:
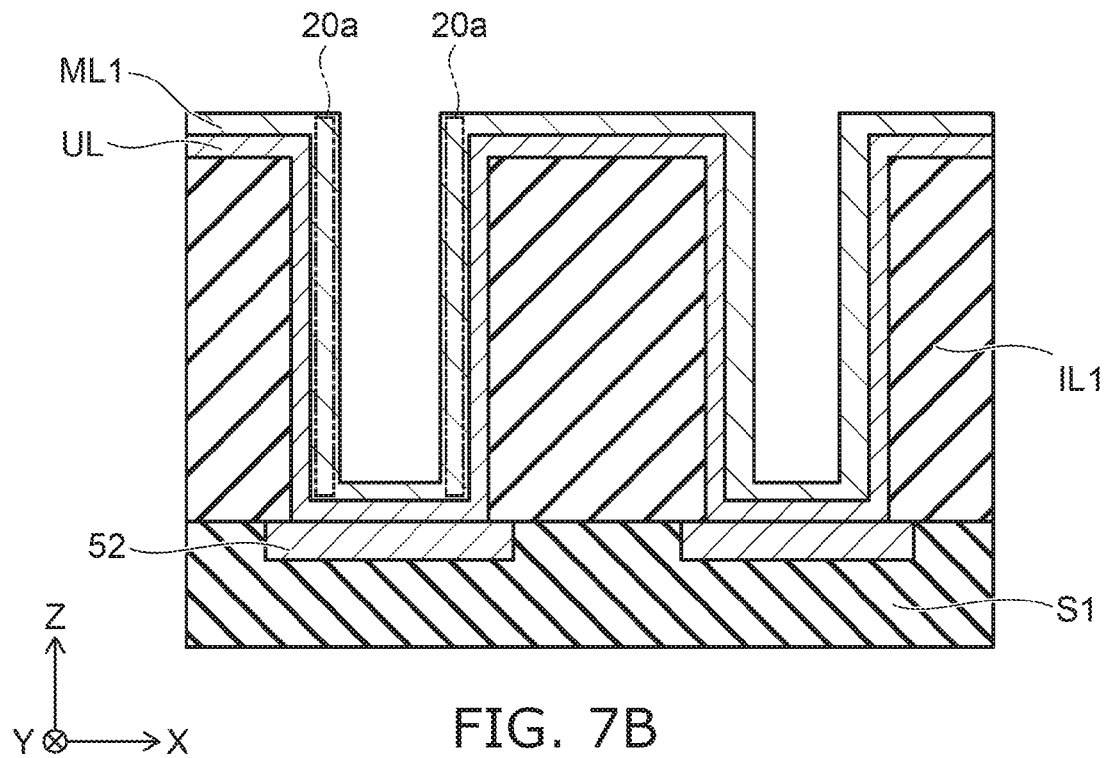

As shown in FIG. 7B, a foundation layer UL and a first magnetic layer ML1 are formed in this order on the inner walls of the holes H. At this time, one portion of the first magnetic layer ML1 is formed in a tubular configuration along the inner wall of the hole H. At least one portion of a tubular unit 20a included in the first magnetic layer ML1 corresponds to the second magnetic unit 20 shown in FIG. 1 and FIG. 2. By providing the foundation layer UL between the first insulating layer IL1 and the first magnetic layer ML1, the easy magnetization axis of the first magnetic layer ML1 can be controlled to be a direction perpendicular to the inner wall surface of the hole H. A first nonmagnetic layer NL1 is formed on the first magnetic layer ML1. The interiors of the holes H are filled with the first nonmagnetic layer NL1.

Figure 8A:
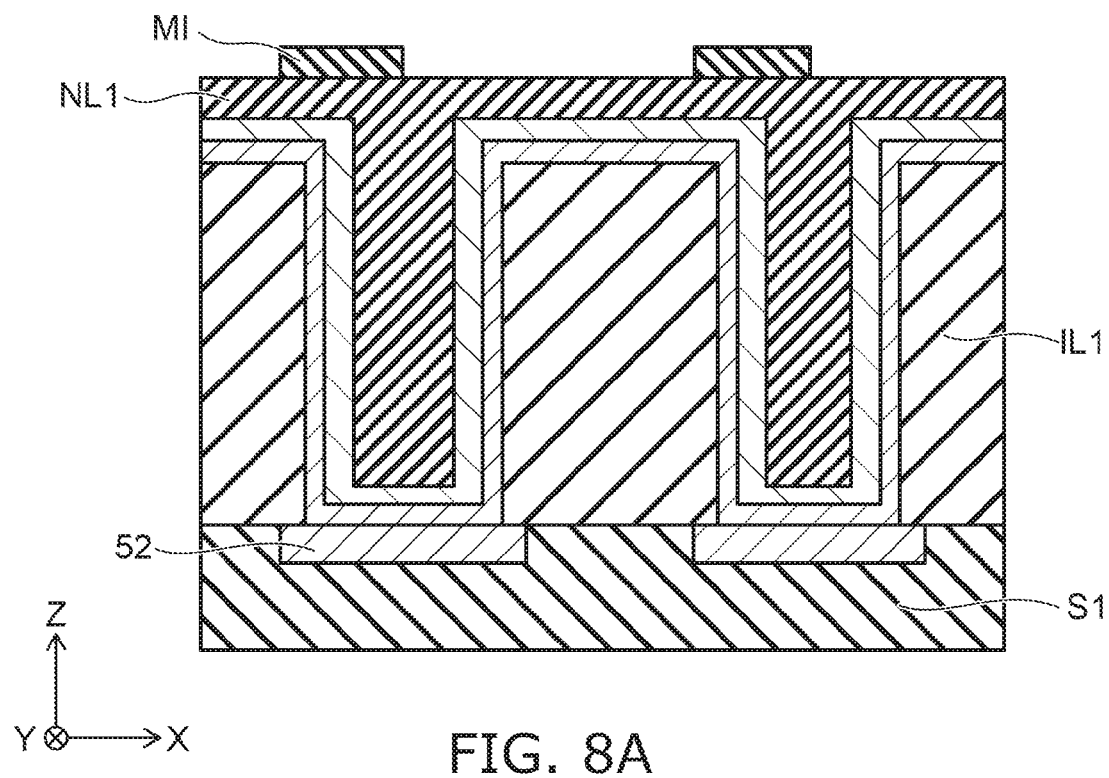

As shown in FIG. 8A, a mask Ml that covers about half of the upper end of the tubular unit 20a is formed. The mask Ml overlaps about half of the upper end of the tubular unit 20a in the first direction. Ion implantation is performed using the mask Ml to change the magnetic physical property values of the portion of the tubular unit 20a not covered with the mask M1. For example, the value of the saturation magnetization and the value of the magnetic anisotropy can be reduced by using an ion of at least one nonmagnetic element of B, C, N, O, F, Si, P, Ga, Ge, In, Mo, W, V, Nb, Ta, Ti, Zr, Hf, Ag, Cu, Au, Al, Mg, Bi, Pd, Pt, Ir, He, Ne, Ar, Kr, Xe, and Rn. Alternatively, an ion of a magnetic element such as Fe, Co, Ni, etc., may be used. In such a case, the magnetic anisotropy mainly can be reduced. In the case where an alloy made of a rare-earth element and a transition metal is used as the material of the second magnetic unit 20, the damping constant changes due to the composition ratio of the alloy. In particular, the damping constant increases at a composition near the compensation composition at which the angular momentum due to the magnetic moment of the rare-earth element and the angular momentum due to the magnetic moment of the transition metal cancel each other and the net angular momentum is zero. Accordingly, for example, in the case where the composition ratio of the transition metal is larger than the compensation composition, the damping constant of the portion not covered with the mask Ml can be reduced by irradiating ions of the transition metal element on this portion. In the case where the composition ratio of the rare-earth element is larger than the compensation composition, the damping constant of the portion not covered with the mask Ml can be reduced by irradiating ions of the rare-earth element on this portion.

For example, the region of the tubular unit 20a covered with the mask M1 corresponds to the first region 21a shown in FIG. 3A. The tubular unit 20a includes a region not covered with the mask M1. For example, this region corresponds to the second region 21b shown in FIG. 3A.

The mask M1 that covers one portion of the upper end of the tubular unit 20a is removed. One portion of the foundation layer UL, one portion of the first magnetic layer ML1, and one portion of the first nonmagnetic layer NL1 that are unnecessary and are formed on the first insulating layer IL1 are removed by, for example, CMP (Chemical Mechanical Polishing).

At this time, one other portion of the first magnetic layer ML1 corresponds to the second magnetic unit 20 shown in FIG. 1 and FIG. 2. One other portion of the first nonmagnetic layer NL1 corresponds to the first insulating unit 61.

Figure 8B:
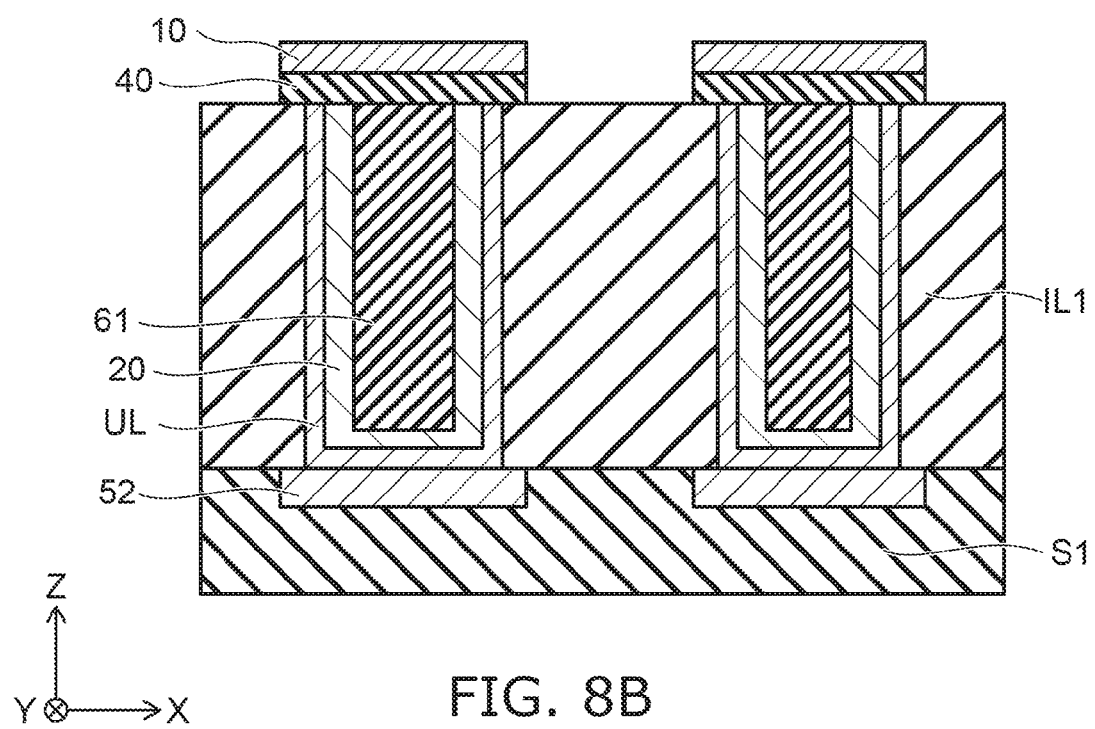

The second nonmagnetic layer and the second magnetic layer are formed on the first insulating layer IL1, on the second magnetic unit 20, and on the first insulating unit 61. As shown in FIG. 8B, the nonmagnetic unit 40 and the first magnetic unit 10 shown in FIG. 1 and FIG. 2 are formed by patterning the second nonmagnetic layer and the second magnetic layer. The second nonmagnetic layer and the second magnetic layer are patterned so that the nonmagnetic unit 40 and the first magnetic unit 10 overlap the second magnetic unit 20 in the first direction.

The first electrode 51 is formed on the second magnetic unit 20. Subsequently, the magnetic memory element 100 shown in FIG. 1 and FIG. 2 is obtained by electrically connecting the first electrode 51 and the second electrode 52 via a controller including a processor, etc.

Figure 9:
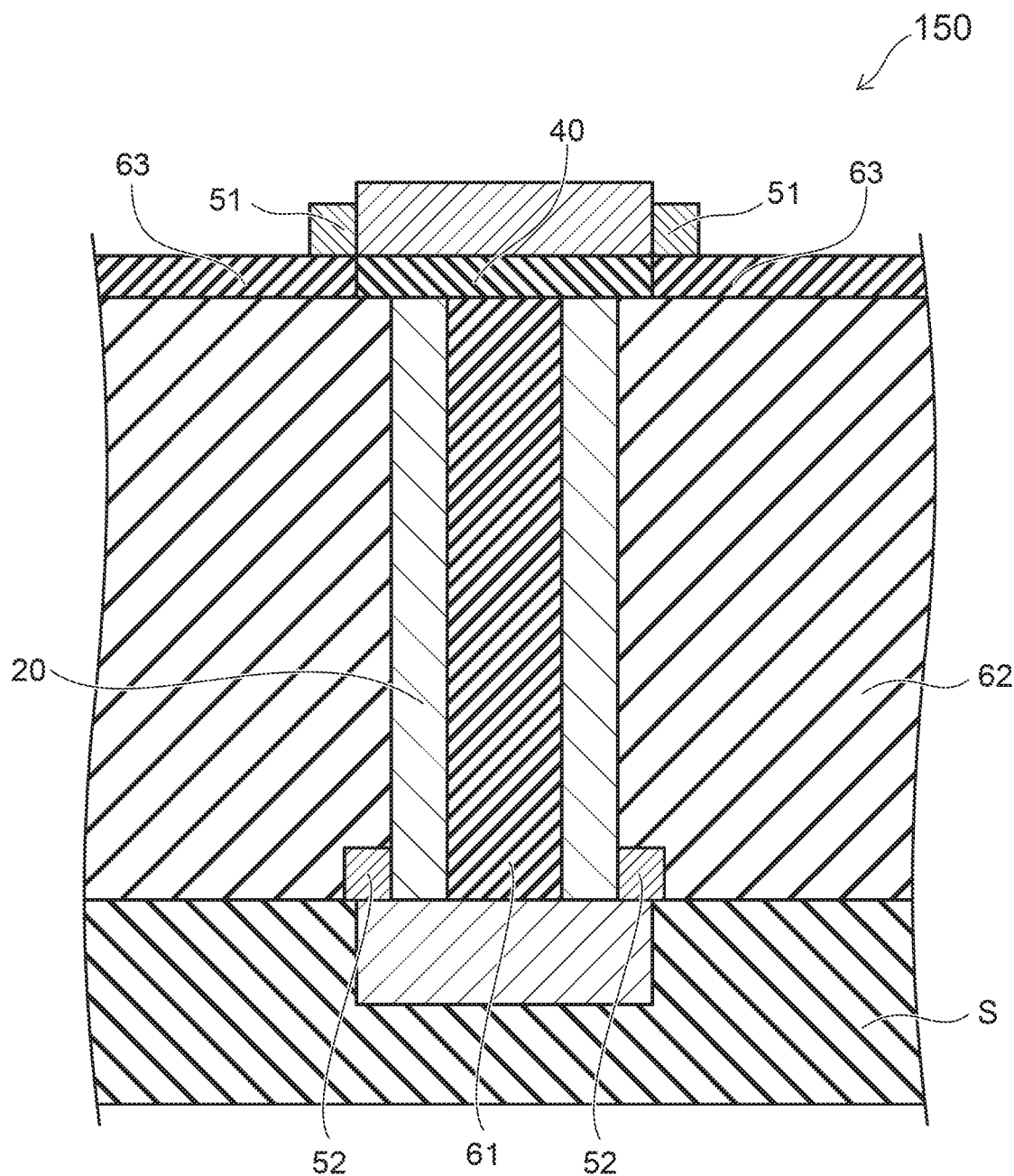
FIG. 9 is a schematic cross-sectional view showing another example of the magnetic memory element according to the first embodiment.

FIG. 9 is a schematic cross-sectional view showing another example of the magnetic memory element according to the first embodiment.

In the magnetic memory element 150 shown in FIG. 9, the first electrode 51 is provided around at least one portion of the first magnetic unit 10. The first electrode 51 and the first magnetic unit 10 overlap in the second direction and the third direction. The second electrode 52 is provided around the second portion 22 of the second magnetic unit 20. The second electrode 52 and the second portion 22 overlap in the second direction and the third direction. For example, one portion of a third insulating unit 63 is provided between the first electrode 51 and one portion of the second insulating unit 62.

Or, the first electrode 51 and the first magnetic unit 10 may overlap in the first direction; and the second portion 22 and the second electrode 52 may overlap in the second direction and the third direction. Or, the first electrode 51 and the first magnetic unit 10 may overlap in the second direction and the third direction; and the second portion 22 and the second electrode 52 may overlap in the first direction.

By using the other magnetic memory element according to the first embodiment described above, higher integration of the magnetic memory element is possible.

Second Embodiment

Figure 10:
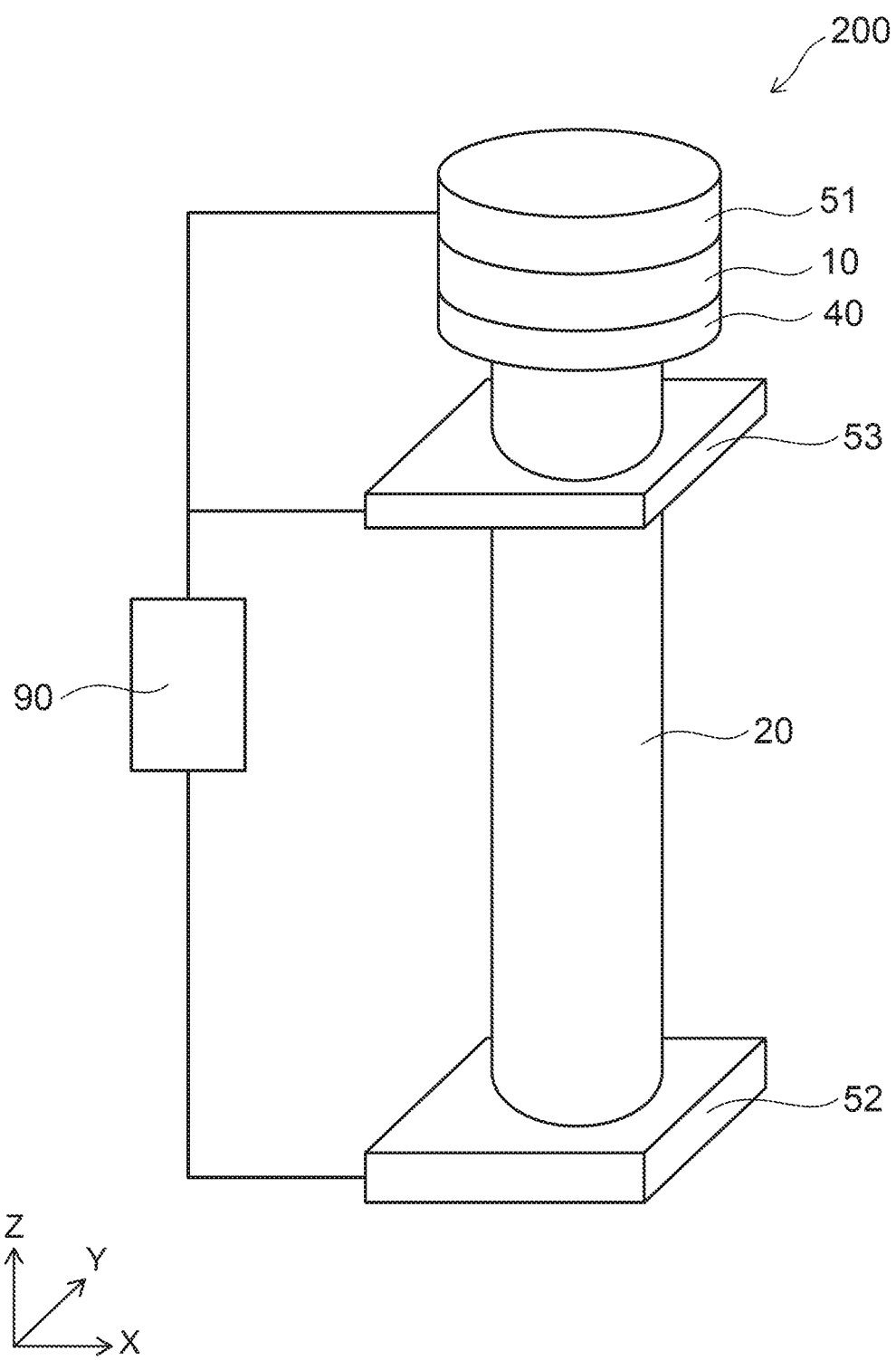
FIG. 10 is a schematic perspective view showing an example of a magnetic memory element according to a second embodiment.

FIG. 10 is a schematic perspective view showing an example of a magnetic memory element according to a second embodiment.

Figure 11:
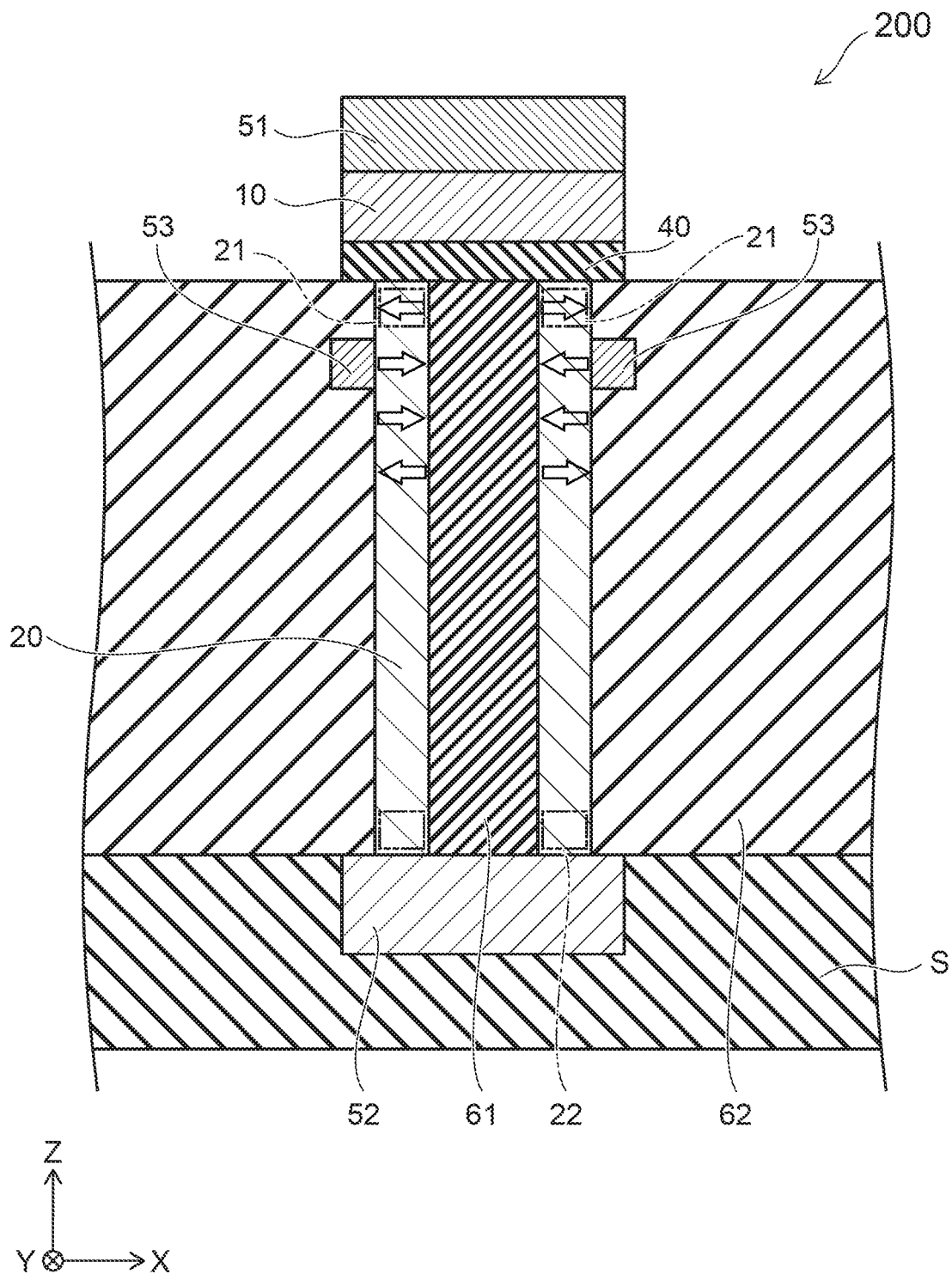
FIG. 11 is a schematic cross-sectional view showing the example of the magnetic memory element according to the second embodiment.

FIG. 11 is a schematic cross-sectional view showing the example of the magnetic memory element according to the second embodiment.

Compared to the magnetic memory element 100, for example, the magnetic memory element 200 according to the second embodiment further includes a third electrode 53. The third electrode 53 is provided around one portion of the second magnetic unit 20. The third electrode 53 and one portion of the second magnetic unit 20 overlap in the second direction and the third direction. The controller 90 is electrically connected to the first electrode 51, the second electrode 52, and the third electrode 53.

The third electrode 53 is provided at the vicinity of the first portion 21. Therefore, as shown in FIG. 11, the distance in the first direction between the nonmagnetic unit 40 and the third electrode 53 is shorter than the distance in the first direction between the second electrode 52 and the third electrode 53.

When performing the writing operation of the magnetic memory element 200, the controller 90 writes to the first portion 21 by causing a current to flow between the first electrode 51 and the third electrode 53.

When performing the shift operation, the controller 90 shifts the multiple magnetic domains included in the second magnetic unit 20 by causing a current to flow between the first electrode 51 and the second electrode 52 or between the second electrode 52 and the third electrode 53.

When performing the read-out operation, the controller 90 senses the magnetization direction of the first portion 21 by causing a current to flow between the first electrode 51 and the second electrode 52 or between the first electrode 51 and the third electrode 53.

According to the embodiment, it is possible to perform the writing operation by causing the current to flow between the first electrode 51 and the third electrode 53. Therefore, when performing the writing operation, the likelihood of the occurrence of unintended shifting of the magnetic domains can be reduced.

Third Embodiment

Figure 12:
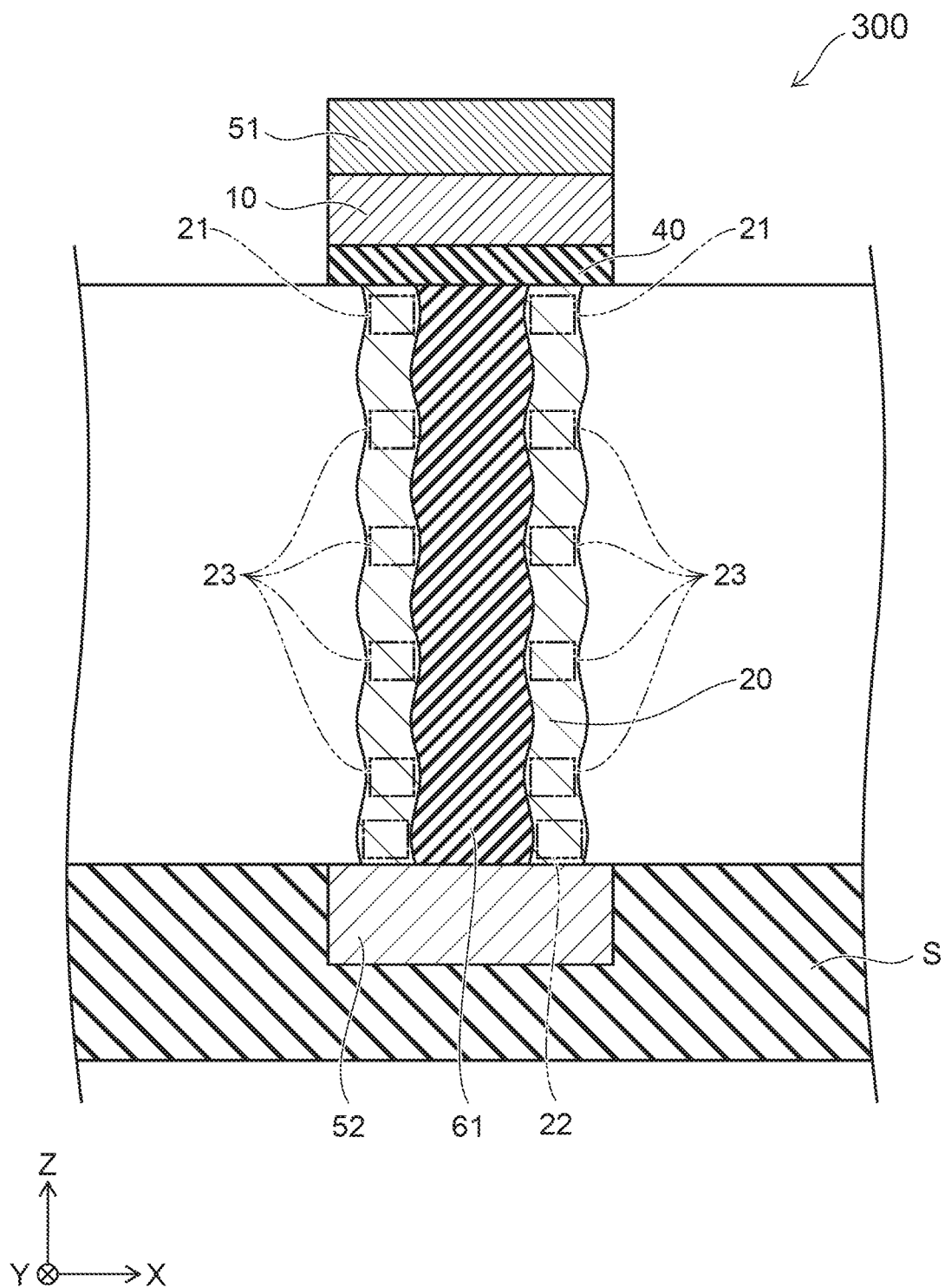
FIG. 12 is a schematic cross-sectional view showing an example of a magnetic memory element according to a third embodiment.

FIG. 12 is a schematic cross-sectional view showing an example of a magnetic memory element according to a third embodiment.

The second insulating unit 62 is not shown in FIG. 12.

Compared to the magnetic memory element 100, for example, the configuration of the second magnetic unit 20 of the magnetic memory element 300 according to the third embodiment is different. In the magnetic memory element 300, the second magnetic unit 20 includes at least one third portion 23 provided between the first portion 21 and the second portion 22. In the example shown in FIG. 12, the second magnetic unit 20 includes multiple third portions 23 arranged in the first direction. The multiple third portions 23 are provided to be separated from each other.

The diameter of the third portion 23 is smaller than the diameter of the first portion 21. For example, the length in the second direction of the third portion 23 is shorter than the length in the second direction of the first portion 21. The length in the third direction of the third portion 23 is shorter than the length in the third direction of the first portion 21.

In the case where the magnetic memory element includes the third portion 23, the domain wall stops easily at the third portion 23. Therefore, the likelihood of the occurrence of unintended domain wall movement when the current is not caused to flow can be reduced.

Similarly to the second embodiment, the magnetic memory element 300 according to the embodiment may further include the third electrode 53.

Fourth Embodiment

Figure 13:
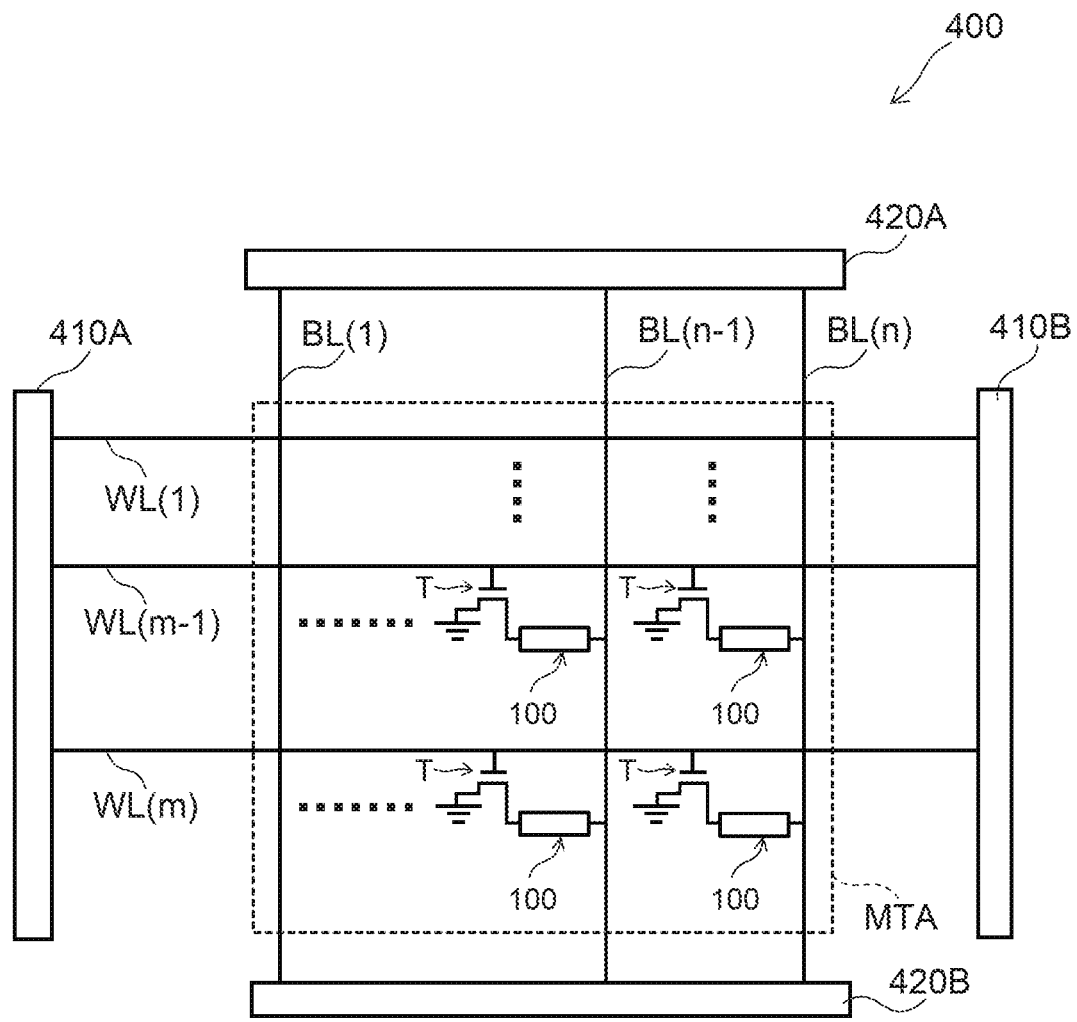
FIG. 13 is a circuit diagram showing an example of a magnetic memory according to a fourth embodiment.

FIG. 13 is a circuit diagram showing an example of a magnetic memory according to a fourth embodiment.

Figure 14:
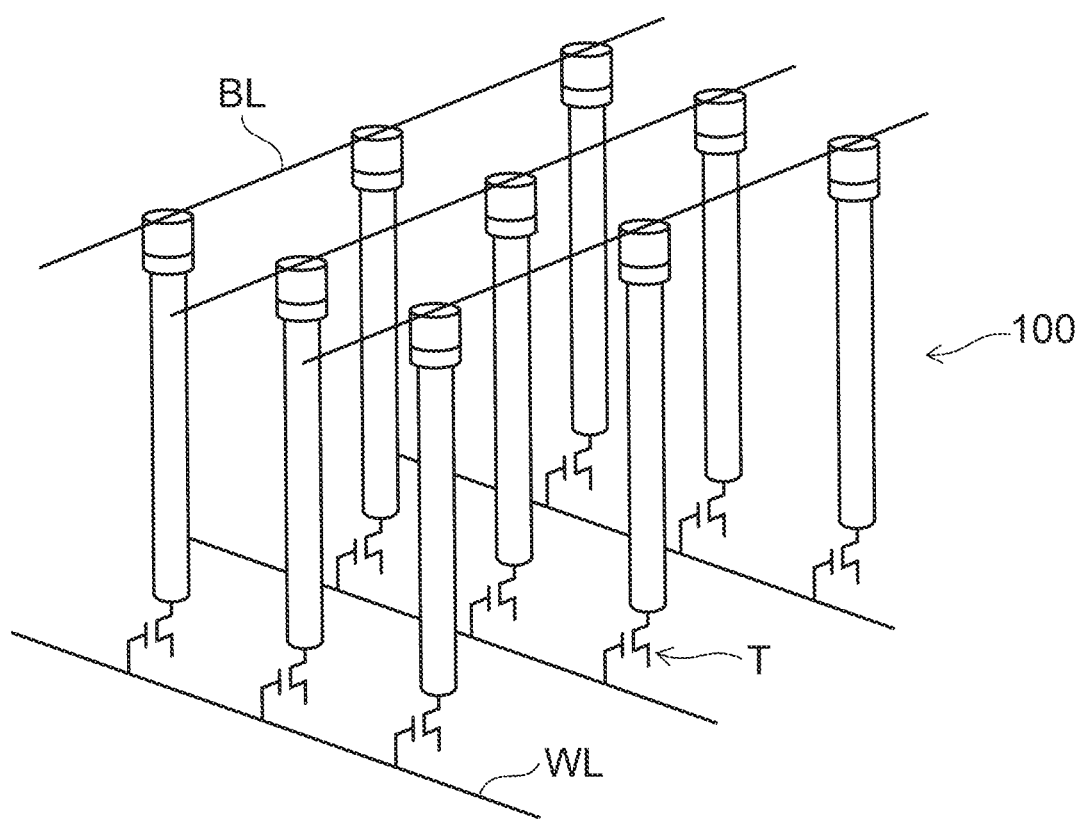
FIG. 14 is a schematic perspective view showing the example of the magnetic memory according to the fourth embodiment.

FIG. 14 is a schematic perspective view showing the example of the magnetic memory according to the fourth embodiment.

The magnetic memory 400 according to the fourth embodiment includes a memory track array MTA, the multiple magnetic memory elements 100 according to the first embodiment, multiple first switching elements T1, drive circuits 410A, 410B, 420A, and 420B, and the controller 90.

The memory track array MTA includes multiple memory tracks arranged in a matrix configuration having m rows and n columns. Each memory track includes the magnetic memory element 100 and the first switching element T1. The first switching element T1 includes, for example, a transistor. The multiple first word lines WL1(1) to WL(m) and the multiple bit lines BL(1) to BL(n) are connected to the memory track array MTA. Each first word line WL1 is connected to multiple memory tracks arranged in the row of the first word line WL1. Each bit line BL is connected to the multiple memory tracks arranged in the column of the bit line BL. The first word lines WL1 are arranged to be parallel to each other. The bit lines BL are arranged to be parallel to each other. The direction in which the bit lines BL extend intersects the direction in which the first word lines WL1 extend.

The first switching element T1 includes a gate terminal, a first terminal, and a second terminal. The gate terminal of the first switching element T1 included in each memory track is connected to the first word line WL1 of the corresponding row. The first terminal is connected to the second electrode 52 of the magnetic memory element 100 inside the same memory track. The second terminal is connected to a fixed potential. For example, the second terminal is grounded. The first electrode 51 of the magnetic memory element 100 is connected to the bit line BL.

The multiple first word lines WL1 are connected to the drive circuits 410A and 410B. The multiple bit lines BL are connected to the drive circuits 420A and 420B.

The movement of the magnetic domains in the magnetic memory element 100 included in the magnetic memory 400 will now be described.

For example, address signals that are input from the controller 90 are decoded by decoders inside the drive circuits 410A, 410B, 420A, and 420B. The magnetic memory element 100 that corresponds to the decoded address is selected; and a current flows in the second magnetic unit 20 of the selected magnetic memory element 100. The magnetic domains (the domain walls) included in the second magnetic unit 20 move due to the current. For example, the direction in which the magnetic domains move is the same as the orientation of the flow of the electrons.

Writing to the magnetic memory elements 100 included in the magnetic memory 400 will now be described.

For example, the address signal that is input from the controller 90 is decoded by the decoders inside the drive circuits 410A, 410B, 420A, and 420B. The first word line WL1 that corresponds to the decoded address is selected; and the corresponding first switching element T1 is switched ON. Subsequently, the writing to the second magnetic unit 20 of the magnetic memory element 100 is performed by causing a current to flow through the bit line BL. At this time, it is possible to write data to the second magnetic unit 20 continuously by alternately performing the movement of one magnetic domain and the writing to the one magnetic domain. By setting the writing current to be smaller than the current necessary for the movement of the magnetic domains, the likelihood of the occurrence of unintended movement when writing can be reduced.

Reading from the magnetic memory elements 100 included in the magnetic memory 400 will now be described.

For example, the address signal that is input from the controller 90 is decoded by the decoders inside the drive circuits 410A, 410B, 420A, and 420B, The magnetic memory element 100 that corresponds to the decoded address is selected. The magnetic domain of the multiple magnetic domains included in the second magnetic unit 20 of the selected magnetic memory element 100 for which the magnetization direction is to be read is moved to the first portion 21. The movement of the magnetic domains is performed by the method described above.

Subsequently, the first word line WL1 that corresponds to the decoded address is selected; and the magnetization direction of the first portion 21 is read by causing a current to flow through the bit line BL by switching the corresponding first switching element T1 ON. At this time, it is possible to read the data of the second magnetic unit 20 continuously by alternately performing the movement of one magnetic domain and the reading of the one magnetic domain.

The current when reading may be either the direction from the first electrode 51 toward the second electrode 52 or the direction from the second electrode 52 toward the first electrode 51. It is desirable for the current when reading to be smaller than the current when writing to suppress the change of the magnetization directions of the magnetic domains included in the second magnetic unit 20 due to the read-out operation.

The magnetic memory 400 according to the embodiment may include the magnetic memory element 300 according to the third embodiment instead of the magnetic memory element 100 according to the first embodiment.

According to the embodiment, a magnetic memory in which the magnetic memory elements are integrated at high density can be provided.

Fifth Embodiment

Figure 15:
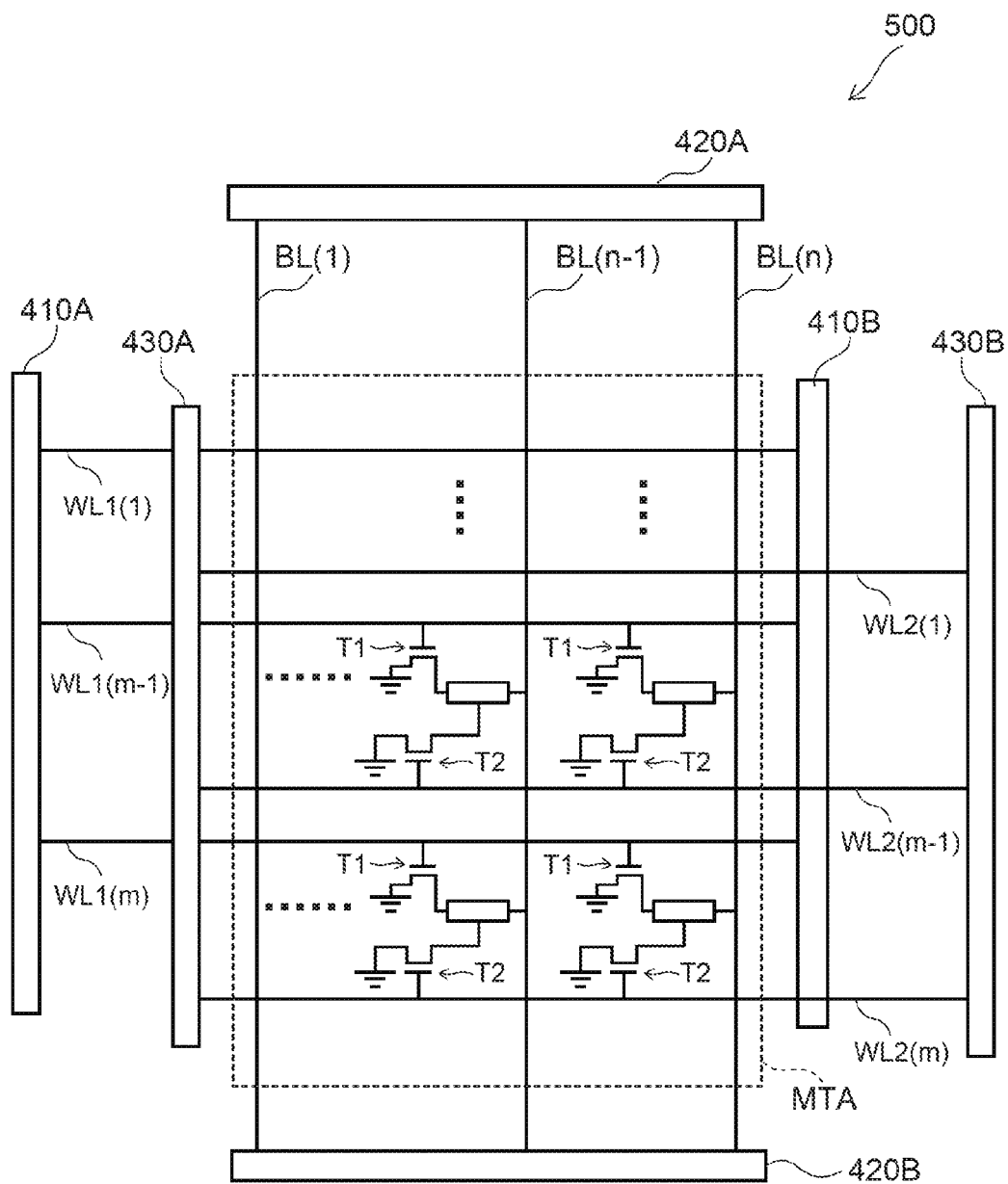
FIG. 15 is a circuit diagram showing an example of a magnetic memory according to a fifth embodiment.

FIG. 15 is a circuit diagram showing an example of a magnetic memory according to a fifth embodiment.

The magnetic memory 500 according to the fifth embodiment includes the memory track array MTA, the multiple magnetic memory elements 200 according to the second embodiment, the multiple first switching elements T1, multiple second switching elements T2, the drive circuits 410A, 410B, 420A, 420B, 430A, and 430B, and the controller 90.

In the magnetic memory 500, each memory track included in the memory track array MTA includes the magnetic memory element 200, the first switching element T1, and the second switching element T2.

The multiple first word lines WL1(1) to WL1(m), the multiple second word lines WL2(1) to WL2(m), and the multiple bit lines BL(1) to BL(n) are connected to the memory track array MTA. The first word line WL1 and a second word line WL2 are connected to the multiple memory tracks arranged in the row of the first word line WL1 and the second word line WL2. Each bit line BL is connected to the multiple memory tracks arranged in the column of the bit line BL.

The first gate terminal of the first switching element T1 included in each memory track is connected to the first word line WL1 of the corresponding row. The first terminal is connected to the second electrode 52 of the magnetic memory element 200 inside the same memory track. For example, the second terminal is grounded.

The second switching element T2 includes a second gate terminal, a third terminal, and a fourth terminal. The second gate terminal of the second switching element T2 included in each memory track is connected to the second word line WL2 of the corresponding row. The third terminal is connected to the third electrode 53 of the magnetic memory element 200 inside the same memory track. For example, the fourth terminal is grounded.

The first electrode 51 of the magnetic memory element 200 is connected to the bit line BL.

The multiple first word lines WL1 are connected to the drive circuits 410A and 410B.

The multiple bit lines BL are connected to the drive circuits 420A and 420B.

The multiple second word lines WL2 are connected to the drive circuits 430A and 430B.

It is possible to perform the movement of the magnetic domains and the reading of the magnetic domains for the magnetic memory elements 200 included in the magnetic memory 500 similarly to the movement operation of the magnetic domains and the read-out operation of the magnetic domains of the magnetic memory 400.

The writing to the magnetic memory elements 200 included in the magnetic memory 500 will now be described.

For example, the address signal that is input from the controller 90 is decoded by the decoders inside the drive circuits 410A, 410B, 420A, 420B, 430A, and 430B. The second word line WL2 that corresponds to the decoded address is selected; and the corresponding second switching element T2 is switched ON. Subsequently, the writing to the second magnetic unit 20 of the magnetic memory element 200 is performed by causing a current to flow between the first electrode 51 and the third electrode 53 by causing a current to flow through the bit line BL. In the embodiment, because the current path when writing is different from the current path when moving the magnetic domain, the likelihood of the occurrence of unintended magnetic domain movement when writing can be reduced.

According to the embodiment, a magnetic memory in which the magnetic memory elements are integrated at high density can be provided.

According to the embodiments described above, a magnetic memory element or a magnetic memory that is suited to higher integration is provided.

Notes

A magnetic memory, comprising:
a first magnetic unit;
a second magnetic unit having a tubular configuration extending in a first direction, the second magnetic unit including a first portion and a second portion, the first portion being provided between the first magnetic unit and the second portion in the first direction, the first portion including
a first region, and
a second region arranged with the first region in a second direction, the second direction intersecting the first direction, a density of a nonmagnetic element in the second region being higher than a density of the nonmagnetic element in the first region; and
a nonmagnetic unit provided between the first magnetic unit and the second magnetic unit.

In this specification, "perpendicular" and "parallel" include not only strictly perpendicular and strictly parallel but also, for example, the fluctuation due to manufacturing processes, etc.; and it is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the first magnetic unit 10, the first layer 11, the second layer 12, the third layer 13, the nonmagnetic layer 14, the second magnetic unit 20, the nonmagnetic unit 40, the first electrode 51, the second electrode 52, the third electrode 53, the first insulating unit 61, the second insulating unit 62, the drive circuits 410A, 410B, 420A, 420B, 430A, and 430B, the controller 90, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all magnetic memory elements and magnetic memories practicable by an appropriate design modification by one skilled in the art based on the magnetic memory elements and the magnetic memories described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory element, comprising:
a first magnetic unit;
a second magnetic unit having a tubular configuration extending in a first direction, the second magnetic unit including a first portion and a second portion, the first portion being provided between the first magnetic unit and the second portion, the first portion including:
a first region having a first saturation magnetization, a first magnetic anisotropy, and a first damping constant, and
a second region arranged with the first region in a second direction, the second direction being perpendicular to the first direction, the second region having at least one of:
a second saturation magnetization smaller than the first saturation magnetization,
a second magnetic anisotropy smaller than the first magnetic anisotropy, and a second damping constant smaller than the first damping constant;
a nonmagnetic unit provided between the first magnetic unit and the second magnetic unit; and
a controller electrically connected to the first magnetic unit and the second magnetic unit,
the controller performing:
a first operation of changing a direction of a magnetization of the first region by causing a first current to flow through the first portion in a first current direction, the first current having a first current value, and
a second operation of changing a direction of a magnetization of the second region by causing a second current to flow through the first portion in a second current direction, the second current having a second current value,
the second current value being less than the first current value, the first current direction being aligned with the first direction, the second current direction being the reverse of the first current direction.

2. The element according to claim 1, wherein the second magnetic unit includes a plurality of magnetic domains arranged in the first direction.

3. The element according to claim 2, wherein the first portion includes one of the plurality of magnetic domains.

4. The element according to claim 1, wherein the controller performs the second operation after the first operation.

5. The element according to claim 4, further comprising:
a first insulating unit; and
a second insulating unit,
the second magnetic unit being provided around the first insulating unit,
the second insulating unit being provided around the magnetic unit,
a direction of a magnetization of the magnetic domain of the first portion being a direction from the first insulating unit toward the second insulating unit or a direction from the second insulating unit toward the first insulating unit.

6. The element according to claim 1, wherein
the first magnetic unit includes:
a first layer; and
a second layer,
the first layer is provided between the nonmagnetic unit and the second layer,
the first layer includes a magnetic material, and
the second layer includes an antiferromagnetic material.

7. The element according to claim 1, wherein the first magnetic unit is magnetized in the second direction.

8. The element according to claim 1, wherein the first portion contacts the nonmagnetic unit.

9. The element according to claim 1, wherein
the second magnetic unit includes a third portion provided between the first portion and the second portion, and
a length in the second direction of the third portion is shorter than a length in the second direction of at least one portion of the first portion.

10. The element according to claim 9, wherein
the second magnetic unit includes a plurality of the third portions, and
the plurality of third portions is arranged to be separated from each other in the first direction between the first portion and the second portion.

11. The element according to claim 1, further comprising:
a first electrode; and
a second electrode,
the first magnetic unit being provided between the first electrode and the nonmagnetic unit,
the second magnetic unit being provided between the second electrode and the nonmagnetic unit.

12. The element according to claim 11, further comprising a third electrode provided around one portion of the second magnetic unit,
the third electrode and the one portion of the second magnetic unit overlapping in the second direction.

13. The element according to claim 12, wherein the controller performs the first operation and the second operation by causing the first current and the second current to flow between the first electrode and the third electrode.

14. The element according to claim 1, wherein a ratio of the first current value to the second current value is not less than 1.5:1 and not more than 5:1.

15. The element according to claim 1, wherein
the first portion includes an alloy of a rare-earth element and a transition metal element, and
a composition ratio of the rare-earth element in the first region is different from a composition ratio of the rare-earth element in the second region.

16. A magnetic memory, comprising:
a plurality of magnetic memory elements, each of the plurality of magnetic memory elements including:
a first magnetic unit;
a second magnetic unit having a tubular configuration extending in a first direction, the second magnetic unit including a first portion and a second portion, the first portion being provided between the first magnetic unit and the second portion, the first portion including a first region and a second region, the first region having a first saturation magnetization, a first magnetic anisotropy, and a first damping constant, the second region arranged with the first region in a second direction, the second direction being perpendicular to the first direction, the second region having at least one of:
a second saturation magnetization smaller than the first saturation magnetization,
a second magnetic anisotropy smaller than the first magnetic anisotropy, and
a second damping constant smaller than the first damping constant; and
a nonmagnetic unit provided between the first magnetic unit and the second magnetic unit;
a first word line;
a first switching element, the first switching element including a first terminal, a second terminal, and a first gate, the first terminal being electrically connected to the second portion of one magnetic memory element of the plurality of magnetic memory elements, the second terminal being connected to a fixed potential, the first gate being connected to the first word line; and
a first bit line electrically connected to the first magnetic unit of the one magnetic memory element of the plurality of magnetic memory elements.

17. A magnetic memory, comprising:
a plurality of magnetic memory elements, each of the plurality of magnetic memory elements including:
a first magnetic unit;
a second magnetic unit having a tubular configuration extending in a first direction, the second magnetic unit including a first portion and a second portion, the first portion being provided between the first magnetic unit and the second portion, the first portion including a first region and a second region, the first region having a first saturation magnetization, a first magnetic anisotropy, and a first damping constant, the second region arranged with the first region in a second direction, the second direction being perpendicular to the first direction, the second region having at least one of:
  a second saturation magnetization smaller than the first saturation magnetization,
  a second magnetic anisotropy smaller than the first magnetic anisotropy, and
  a second damping constant smaller than the first damping constant;
a nonmagnetic unit provided between the first magnetic unit and the second magnetic unit; and
a third electrode provided around one portion of the second magnetic unit, the third electrode and the one portion of the second magnetic unit overlapping in the second direction;
a first word line;
a second word line;
a first switching element, the first switching element including a first terminal, a second terminal, and a first gate, the first terminal being electrically connected to the second portion of one magnetic memory element of the plurality of magnetic memory elements, the second terminal being connected to a fixed potential, the first gate being connected to the first word line;
a second switching element, the second switching element including a third terminal, a fourth terminal, and a second gate, the third terminal being electrically connected to the third electrode of one magnetic memory element of the plurality of magnetic memory elements, the fourth terminal being connected to a fixed potential, the second gate being connected to the second word line; and
a first bit line electrically connected to the first magnetic unit of the one magnetic memory element of the plurality of magnetic memory elements.

* * * * *